US011175358B2

(12) United States Patent
Wang et al.

(10) Patent No.: US 11,175,358 B2
(45) Date of Patent: Nov. 16, 2021

(54) MAGNETIC SENSORS WITH A MIXED OXIDE PASSIVATION LAYER

(71) Applicant: MagArray, Inc., Milpitas, CA (US)

(72) Inventors: Shan Xiang Wang, Palo Alto, CA (US); Sebastian J. Osterfeld, Ann Arbor, MI (US)

(73) Assignee: MagArray, Inc., Milpitas, CA (US)

( * ) Notice: Subject to any disclaimer, the term of this patent is extended or adjusted under 35 U.S.C. 154(b) by 125 days.

(21) Appl. No.: 16/446,296

(22) Filed: Jun. 19, 2019

(65) Prior Publication Data

US 2020/0041585 A1 Feb. 6, 2020

Related U.S. Application Data

(60) Provisional application No. 62/688,935, filed on Jun. 22, 2018.

(51) Int. Cl.
| | |
|---|---|
| *G01R 33/09* | (2006.01) |
| *H01F 10/32* | (2006.01) |
| *H01F 10/30* | (2006.01) |
| *H01L 27/22* | (2006.01) |
| *H01L 43/02* | (2006.01) |
| *H01L 43/10* | (2006.01) |

(52) U.S. Cl.
CPC .......... *G01R 33/093* (2013.01); *H01F 10/30* (2013.01); *H01F 10/3259* (2013.01); *H01F 10/3268* (2013.01); *H01L 27/22* (2013.01); *H01L 43/02* (2013.01); *H01L 43/10* (2013.01); *Y10T 428/32* (2015.01)

(58) Field of Classification Search
None
See application file for complete search history.

(56) References Cited

U.S. PATENT DOCUMENTS

| | | | |
|---|---|---|---|
| 7,282,904 B2* | 10/2007 | Suquet | G01R 15/185 324/117 H |
| 7,906,345 B2 | 3/2011 | Wang et al. | |
| 9,863,939 B2 | 1/2018 | Wang et al. | |
| 10,267,871 B2 | 4/2019 | Osterfeld et al. | |
| 2009/0104707 A1 | 4/2009 | Wang et al. | |
| 2011/0027901 A1 | 2/2011 | Gaster et al. | |

(Continued)

FOREIGN PATENT DOCUMENTS

WO WO 2013/109559 7/2013

*Primary Examiner* — Kevin M Bernatz
(74) *Attorney, Agent, or Firm* — Rudy J. Ng; Bozicevic, Field & Francis LLP

(57) ABSTRACT

Aspects of the present disclosure include magnetic sensor devices having a mixed oxide passivation layer. Magnetic sensor devices according to certain embodiments include a magnetic sensor element and a passivation layer having two or more of zirconium oxide, aluminum oxide and tantalum oxide. Also provided are magnetic sensor devices having an encapsulating passivation layer. Magnetic sensor devices according to certain embodiments include a substrate, a magnetic sensor element and a passivation layer that encapsulates the magnetic sensor element. Methods for making a magnetic sensor with a passivation layer are described. Methods and systems for detecting one or more analytes in a sample are also described. Aspects further include kits having one or more of the subject magnetic sensor devices and a magnetic label.

21 Claims, 3 Drawing Sheets

(56) References Cited

U.S. PATENT DOCUMENTS

| | | | |
|---|---|---|---|
| 2013/0012034 A1 | 1/2013 | Ahn et al. | |
| 2014/0111191 A1* | 4/2014 | Andre | G01P 3/487 |
| | | | 324/207.2 |
| 2014/0266186 A1* | 9/2014 | Osterfeld | G01R 33/098 |
| | | | 324/252 |
| 2016/0334370 A1* | 11/2016 | Osterfeld | G01N 27/745 |
| 2017/0213570 A1* | 7/2017 | Cheng | G11B 5/314 |

\* cited by examiner

MAGNETIC SENSORS WITH A MIXED OXIDE PASSIVATION LAYER

CROSS-REFERENCE TO RELATED APPLICATIONS

This application claims priority pursuant to 35 U.S.C. § 119(e) to the filing date of U.S. Provisional Patent Application No. 62/688,935, filed Jun. 22, 2018, the disclosure of which is incorporated herein by reference in its entirety.

INTRODUCTION

Biomarkers are specific analytes like RNA, DNA and proteins that can be used as surrogates for a mechanism of action, disease state or clinical endpoint. In particular, multiplexed or multimarker approaches may be used in molecular diagnostics and personalized medicine, whose goal is to identify the right treatment for the right patient at the right time and dose, or to detect early complex diseases such as cancer and cardiovascular diseases sensitively and specifically. DNA and protein microarrays have been developed to accommodate a large number of biomarkers.

Magnetoresistive (giant magnetoresistive, tunnel magnetoresistive) biosensors are electrically conductive devices fabricated from metallic magnetoresistive thin films, which include multiple layers, each only a few nanometers thick. The metal layers of a giant magnetoresistive or giant magnetoresistive film typically are alloys comprised of the elements of iron, nickel, cobalt, manganese, copper, ruthenium, tantalum, and boron. Many of these metal layers readily oxidize when exposed to ambient air, ambient humidity, or aqueous liquids such as biological fluids, and such oxidation or corrosion will result in a reduction or total loss of the sensor's functionality.

SUMMARY

Aspects of the present disclosure include magnetic sensor devices having a mixed oxide passivation layer. Magnetic sensor devices according to certain embodiments include a magnetic sensor element and a passivation layer of two or more of zirconium oxide, aluminum oxide and tantalum oxide. Also provided are magnetic sensor devices having an encapsulating passivation layer. Magnetic sensor devices according to certain embodiments include a substrate, a magnetic sensor element and a passivation layer that encapsulates the magnetic sensor element. Methods for making a magnetic sensor with a passivation layer are described. Methods and systems for detecting one or more analytes in a sample are also described. Aspects further include kits having one or more of the subject magnetic sensor devices and a magnetic label.

BRIEF DESCRIPTION OF THE FIGURES

The disclosure may be best understood from the following detailed description when read in conjunction with the accompanying drawings. Included in the drawings are the following figures.

DETAILED DESCRIPTION

Figure 1:
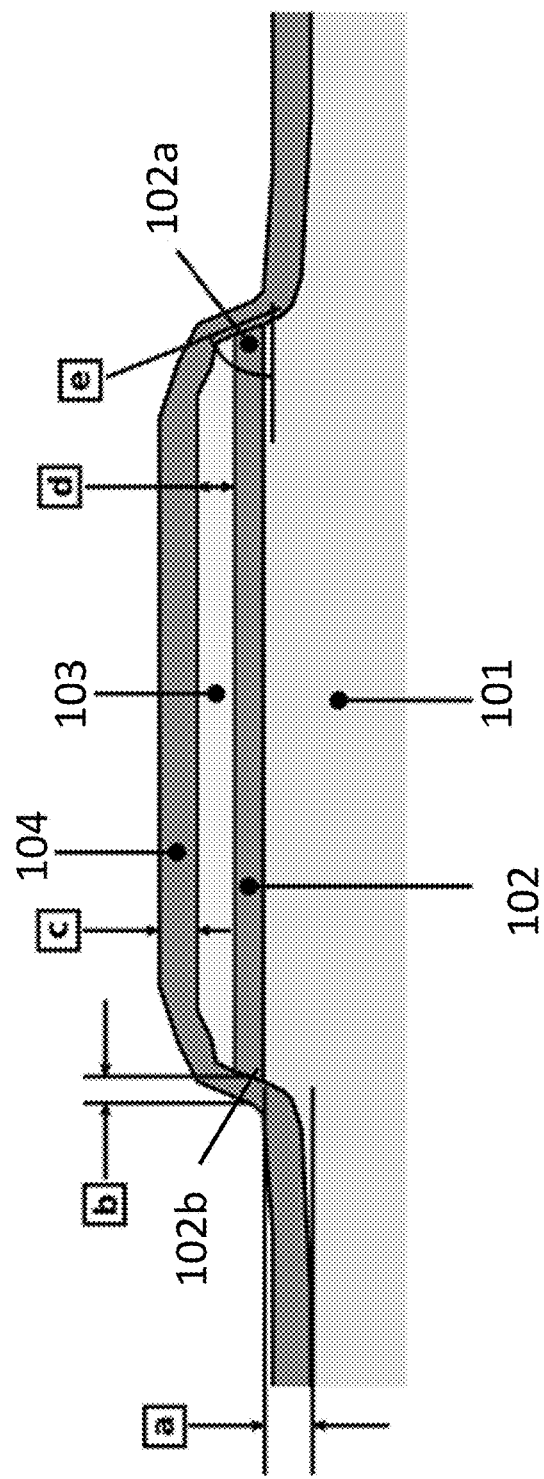
FIG. 1 depicts a magnetic sensor device having an encapsulating passivation layer according to certain embodiments.

Aspects of the present disclosure include magnetic sensor devices having a mixed oxide passivation layer. Magnetic sensor devices according to certain embodiments include a magnetic sensor element and a passivation layer of two or more of zirconium oxide, aluminum oxide and tantalum oxide. Also provided are magnetic sensor devices having an encapsulating passivation layer. Magnetic sensor devices according to certain embodiments include a substrate, a magnetic sensor element and a passivation layer that encapsulates the magnetic sensor element. Methods for making a magnetic sensor with a passivation layer are described. Methods and systems for detecting one or more analytes in a sample are also described. Aspects further include kits having one or more of the subject magnetic sensor devices and a magnetic label.

Before the present invention is described in greater detail, it is to be understood that this invention is not limited to particular embodiments described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limit of that range and any other stated or intervening value in that stated range, is encompassed within the invention. The upper and lower limits of these smaller ranges may independently be included in the smaller ranges and are also encompassed within the invention, subject to any specifically excluded limit in the stated range. Where the stated range includes one or both of the limits, ranges excluding either or both of those included limits are also included in the invention.

Certain ranges are presented herein with numerical values being preceded by the term "about." The term "about" is used herein to provide literal support for the exact number that it precedes, as well as a number that is near to or approximately the number that the term precedes. In determining whether a number is near to or approximately a specifically recited number, the near or approximating unrecited number may be a number which, in the context in which it is presented, provides the substantial equivalent of the specifically recited number.

Unless defined otherwise, all technical and scientific terms used herein have the same meaning as commonly understood by one of ordinary skill in the art to which this invention belongs. Although any methods and materials similar or equivalent to those described herein can also be used in the practice or testing of the present invention, representative illustrative methods and materials are now described.

All publications and patents cited in this specification are herein incorporated by reference as if each individual publication or patent were specifically and individually indicated to be incorporated by reference and are incorporated herein by reference to disclose and describe the methods and/or materials in connection with which the publications are cited. The citation of any publication is for its disclosure prior to the filing date and should not be construed as an admission that the present invention is not entitled to antedate such publication by virtue of prior invention. Further, the dates of publication provided may be different from the actual publication dates which may need to be independently confirmed.

It is noted that, as used herein and in the appended claims, the singular forms "a", "an", and "the" include plural referents unless the context clearly dictates otherwise. It is further noted that the claims may be drafted to exclude any optional element. As such, this statement is intended to serve as antecedent basis for use of such exclusive terminology as "solely," "only" and the like in connection with the recitation of claim elements, or use of a "negative" limitation.

As will be apparent to those of skill in the art upon reading this disclosure, each of the individual embodiments described and illustrated herein has discrete components and features which may be readily separated from or combined with the features of any of the other several embodiments without departing from the scope or spirit of the present invention. Any recited method can be carried out in the order of events recited or in any other order which is logically possible.

In further describing embodiments of the disclosure, magnetic sensor devices having a magnetic sensor element and a mixed oxide passivation layer are first described in greater detail. Next, magnetic sensors having an encapsulating passivation layer are described, followed by a description of methods for depositing the passivation layer onto a magnetic sensor device. Systems and methods in which the subject magnetic sensor devices find use are provided.

Magnetic Sensor Devices with a Mixed Oxide Passivation Layer

As summarized above, aspects of the disclosure include magnetic sensor devices having a mixed oxide passivation layer. Magnetic sensor devices according to certain embodiments include a magnetic sensor element and a passivation layer of zirconium oxide, aluminum oxide and tantalum oxide. As described in greater detail below, the passivation layer is configured to provide resilience to the magnetic sensor element of the magnetic sensor devices. In some embodiments, the passivation layer is configured to reduce or altogether eliminate dissolution with acids and bases. In other embodiments, the passivation layer is configured to provide resistance of the magnetic sensor element from corrosion. In embodiments, the passivation layers described herein provide for a reduction in corrosion of the magnetic sensor element as compared to magnetic sensor devices which do not have a passivation layer, such as where the subject passivation layers reduces corrosion by 10% or more, such as 25% or more, such as 50% or more, such as 75% or more, such as 90% or more and including reducing the amount of corrosion by the magnetic sensor element by 99% or more. In certain embodiments, the passivation layers described herein provide for a reduction in corrosion of the magnetic sensor element as compared to magnetic sensor devices which employ other types of passivation layers, such as silicon oxide-silicon nitride-silicon oxide layers, such as where the subject passivation layers reduces corrosion by 10% or more, such as 25% or more, such as 50% or more, such as 75% or more, such as 90% or more and including reducing the amount of corrosion by the magnetic sensor element by 99% or more. In certain embodiments, the subject passivation layers altogether eliminate corrosion of the magnetic sensor element.

In embodiments, the subject passivation layers include a mixture of different metal oxides. In some embodiments, the passivation layer includes one or more of zirconium oxide (e.g., $ZrO_2$), aluminum oxide (e.g., $Al_2O_3$) and tantalum oxide (e.g., $Ta_2O_5$). For example, the passivation layer may include two or more of zirconium oxide (e.g., $ZrO_2$), aluminum oxide (e.g., $Al_2O_3$) and tantalum oxide (e.g., $Ta_2O_5$). In some embodiments, the passivation layer includes zirconium oxide and tantalum oxide. In other embodiments, the passivation layer includes zirconium oxide and aluminum oxide. In still other embodiments, the passivation layer includes tantalum oxide and aluminum oxide. In yet other embodiments, the passivation layer includes zirconium oxide, aluminum oxide and tantalum oxide. Each of these components may be present in the passivation layer in an amount that varies depending on the properties of the passivation layer desired. In some embodiments, the atomic percentage of zirconium in the passivation layer ranges from 30% to 70%, such as from 35% to 65% and including from 40% to 60%; the atomic percentage of aluminum in the passivation layer ranges from 0% to 40%, such as from 5% to 35%, such as from 10% to 30% and including from 15% to 25%; the atomic percentage of tantalum in the passivation layer ranges from 30% to 70%, such as from 35% to 65% and including from 40% to 60%. In some embodiment, the amount of zirconium oxide present may range from about 15% by weight to about 65% by weight, such as from about 20% by weight to about 60% by weight and including from about 25% by weight to about 55% by weight, where the amount of aluminum oxide present may range from about 0% by weight to about 25% by weight, such as from about 5% by weight to about 20% by weight, such as from about 10% by weight to about 15% by weight and including from about 12% by weight to about 15% by weight and where the amount of tantalum oxide present may range from about 35% by weight to about 90% by weight, such as from about 40% by weight to about 85% by weight, such as from about 45% by weight to about 80% by weight and including from about 52.5% by weight to about 57.5% by weight.

In certain embodiments, the passivation layer includes a combination of zirconium oxide, aluminum oxide and tantalum oxide. In these embodiments, the amount of each component may vary, such as where: zirconium oxide may be present in the passivation layer in an amount that ranges from about 15% by weight to about 65% by weight, such as from about 25% by weight to about 45% by weight and including from about 30% by weight to about 40% by weight; aluminum oxide may be present in the passivation layer in an amount that ranges from about 0% by weight to about 25% by weight, such as from about 5% by weight to about 20% by weight, such as from about 10% by weight to about 15% by weight and including from about 12% by weight to about 15% by weight; tantalum oxide may be present in the passivation layer in an amount that ranges from about 35% by weight to about 90% by weight, such as from about 40% by weight to about 85% by weight, such as from about 45% by weight to about 80% by weight and including from about 52.5% by weight to about 57.5% by weight. In certain embodiments, the passivation layer includes zirconium oxide in an amount of about 31% by weight; aluminum oxide in an amount of about 13% by weight; and tantalum oxide in an amount of about 56% by weight.

The thickness of the passivation layer may vary depending on the size of the magnetic sensor element and the mixed oxide components, and may be 60 nm or less, such as 50 nm or less, including 40 nm or less, 30 nm or less, 20 nm or less, 10 nm or less. For example, the passivation layer may have a thickness of 1 nm to 50 nm, such as from 1 nm to 40 nm, including from 1 nm to 30 nm, or form 1 nm to 20 nm. In some instances, the passivation layer has a thickness of 30 nm.

In embodiments, the subject magnetic sensor devices may include one or more passivation layers, such as 2 or more, such as 3 or more and including 5 or more. In certain embodiments, the passivation layer is a single passivation layer and the magnetic sensor device consists of a single passivation layer as described herein.

In some embodiments, the passivation layer encapsulates the magnetic sensor element of the subject magnetic sensor devices. In certain instances, as described in greater detail below the magnetic sensor includes a substrate, a magnetic sensor element positioned on top of the substrate, a mask layer positioned on top of the magnetic sensor element and the passivation layer is disposed on top of the mask layer. In embodiments where the passivation layer encapsulates the magnetic sensor element, the passivation layer may extend from the top of the mask layer onto the substrate. In these embodiments, the passivation layer covers the edges of the magnetic sensor element such that no part of the magnetic sensor element is exposed to the ambient environment. In certain instances, the substrate includes a recess at the edge surfaces of the magnetic sensor element such that the substrate beneath the magnetic sensor element is higher than the substrate in the recess. In these embodiments, the passivation layer covers at least part of the surface of the recess, such as 10% or more of the recess, such as 15% or more, such as 25% or more, such as 50% or more, such as 60% or more, such as 70% or more, such as 80% or more, such as 90% or more, such as 95% or more, such as 99% or more and including 99.9% or more of the surface of the recess. In certain embodiments, the entire recess surface is covered by the passivation layer (i.e., 100% of the surface of the recess).

The depth of the recess may vary depending on the thickness of the magnetic sensor device substrate and may range from 20 nm to 300 nm, such as from 25 nm to 275 nm, such as from 30 nm to 250 nm, such as from 35 nm to 225 nm, such as from 40 nm to 200 nm, such as from 45 nm to 175 nm and including from 50 nm to 150 nm. In some embodiments, the depth of the recess ranges from 50 nm to 100 nm. In certain embodiments, the depth of the recess is greater than the thickness of the passivation layer disposed on top of the mask layer. For example, the depth of the recess may be 5% or more than the thickness of the passivation layer disposed on top of the mask layer, such as 10% or more, such as 15% or more, such as 25% or more, such as 50% or more, such as 75% or more, such as 90% or more, such as 90% or more and including where depth of the recess is 95% or more than the thickness of the passivation layer. In some instances, the depth of the recess is 1.5-fold greater than the thickness of the passivation layer, such as 2-fold greater, such as 2.5-fold greater, such as 3-fold greater, such as 3.5-fold greater, such as 4-fold or greater, such as 4.5-fold or greater and including where the depth of the recess is 5-fold or greater than the thickness of the passivation layer.

In embodiments where the passivation layer encapsulates the magnetic sensor element, the passivation layer may have varying thicknesses. In some embodiments, the thickness of the passivation layer disposed on top of the mask layer differs from the thickness on top of the recess and further differs from the thickness of the passivation layer that extends from the top of the mask layer to the recess (i.e., the part of the passivation layer that covers the edges of the magnetic sensor element).

In some embodiments, the thickness of the passivation layer that covers the edge of the magnetic sensor element is less than the thickness of the passivation layer disposed on top of the mask layer. For example, the passivation layer that covers the edge of the magnetic sensor element may have a thickness that is less than the thickness of the passivation layer disposed on top of the mask layer by 1 nm or more, such as by 2 nm or more, such as by 3 nm or more, such as by 5 nm or more and including by 10 nm or more. In some instances, the passivation layer that covers the edge of the magnetic sensor element has a thickness that is less than the thickness of the passivation layer disposed on top of the mask layer by 5% or more, such as 10% or more, such as 15% or more, such as 25% or more, such as 50% or more, such as 75% or more, such as 90% or more, such as 90% or more and including where the passivation layer that covers the edge of the magnetic sensor element has a thickness that less than the thickness of the passivation layer disposed on top of the mask layer by 95% or more. In some instances, the thickness of the passivation layer disposed on top of the mask layer is 1.5-fold greater than the thickness of the passivation layer that covers the edges of the magnetic sensor element, such as 2-fold greater, such as 2.5-fold greater, such as 3-fold greater, such as 3.5-fold greater, such as 4-fold greater, such as 4.5-fold greater and including 5-fold greater.

In some embodiments, the thickness of the passivation layer that covers the substrate recess is greater than the thickness of the passivation layer disposed on top of the mask layer. For example, the thickness of the passivation layer that covers the substrate recess may be 1 nm or more than the thickness of the passivation layer disposed on top of the mask layer, such as 2 nm or more, such as 3 nm or more, such as 5 nm or more and including 10 nm or more. In some the thickness of the passivation layer that covers the substrate recess is 5% or more than the thickness of the passivation layer disposed on top of the mask layer, such as 10% or more, such as 15% or more, such as 25% or more, such as 50% or more, such as 75% or more, such as 90% or more, such as 90% or more and including where thickness of the passivation layer that covers the substrate recess is 95% or more than the thickness of the passivation layer disposed on top of the mask layer. In some instances, the depth of the recess is 1.5-fold greater than the thickness of the passivation layer, such as 2-fold greater, such as 2.5-fold greater, such as 3-fold greater, such as 3.5-fold greater, such as 4-fold greater, such as 4.5-fold greater and including where the depth of the recess is 5-fold greater than the thickness of the passivation layer disposed on top of the mask layer.

The thickness of the passivation layer that covers different components of the magnetic sensor device may vary. In some embodiments, the passivation layer disposed on top of the mask layer has a thickness of from about 10 nm to about 200 nm, such as from 15 nm to 175 nm, such as from 20 nm to 150 nm, such as from 25 nm to 125 nm and including from 30 nm to 100 nm. In certain embodiments, the passivation layer disposed on top of the mask layer has a thickness of 30 nm. In some embodiments, the thickness of the passivation layer that extends from the top of the mask layer to the substrate (i.e., the passivation layer that covers the edges of the magnetic sensor element) ranges from 10 nm to 100 nm, such as from 15 nm to 75 nm and including from 20 nm to 50 nm. In certain embodiments, the thickness of the passivation layer that extends from the top of the mask layer to the substrate is about 25 nm. The thickness of the passivation layer that covers the substrate recess also varies, ranging from 20 nm to 300 nm, such as from 25 nm to 275 nm, such as from 30 nm to 250 nm, such as from 35 nm to 225 nm, such as from 40 nm to 200 nm, such as from 45 nm to 175 nm and including from 50 nm to 150 nm. In some embodiments, the thickness of the passivation layer that covers the substrate recess ranges from 50 nm to 100 nm.

The angle of the edges of the magnetic sensor element may vary, ranging from about 30° to about 90°, such as from about 35° to about 85°, such as from about 40° to about 80°, such as from about 45° to about 75° and including from about 50° to about 70°.

In some embodiments, the deposited passivation layer is annealed. The term "annealed" is used in its conventional sense to refer to treating the passivation layer to a curing process which strengthens the passivation layer. In certain embodiments, the deposited passivation layer is a thermally annealed passivation layer. In certain embodiments, the annealed passivation layer exhibits reduced brittleness as compared to a non-annealed passivation layer. In other embodiments, the annealed passivation layer exhibits increased smoothness as compared to a non-annealed passivation layer. In yet other embodiments, the annealed passivation layer exhibits increased ductility as compared to a non-annealed passivation layer. In still other embodiments, the annealed passivation layer exhibits improved reduction in corrosion of the underlying magnetic sensor element as compared to a non-annealed passivation layer. For example, magnetic sensor devices having an annealed passivation layer reduces corrosion by 10% or more, such as 25% or more, such as 50% or more, such as 75% or more, such as 90% or more and including reducing the amount of corrosion by the magnetic sensor element by 99% or more as compared to a magnetic sensor device having a non-annealed passivation layer.

Figure 2:
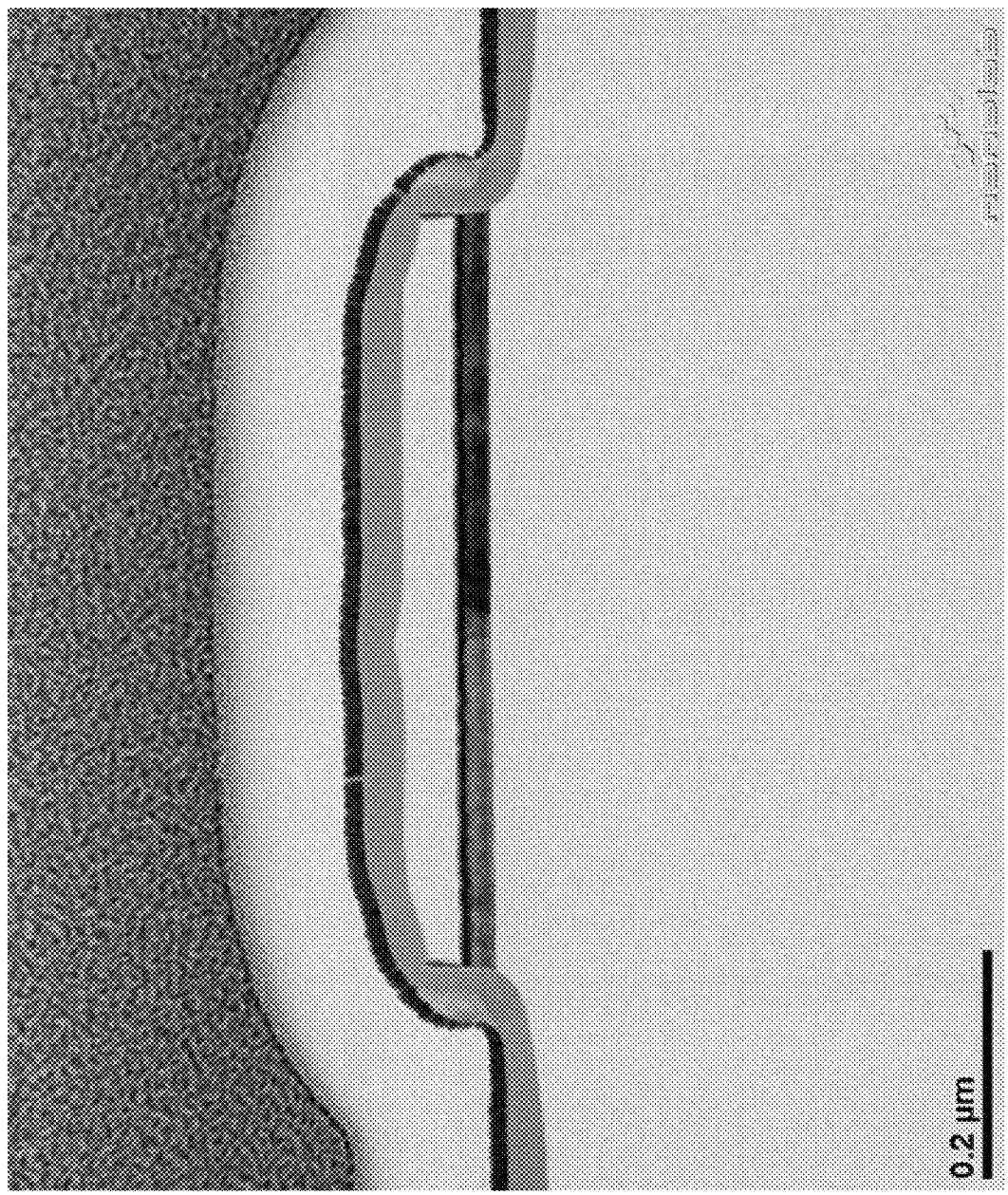
FIG. 2 depicts a microscope cross-section of a magnetic sensor device having a passivation layer which encapsulates the magnetic sensor element.

FIG. 1 depicts a magnetic sensor device having an encapsulating passivation layer according to certain embodiments. Magnetic sensor device 100 includes a substrate 101 having a recess of thickness "a". Disposed on top of the substrate is magnetic sensor element 102 having edges 102*a* and 102*b*. Magnetic sensor element 102 has edges 102*a* and 102*b* that have an angle "e". A mask layer 103 having a thickness "d" is disposed on top of magnetic sensor element 102. Mask layer 103 is covered by passivation layer 104 having a thickness "c" on top of the mask layer. The thickness of the passivation layer that extends from the top of the mask layer to the substrate recess has a thickness "b" which is less than thickness "c". FIG. 2 depicts a microscope cross-section of a magnetic sensor device having a passivation layer which encapsulates the magnetic sensor element.

Methods of Making a Mixed Oxide Passivation Layer

As summarized above, aspects of the present disclosure also include methods for producing a mixed oxide passivation layer. In embodiments, methods include applying a mixed oxide layer on top of a magnetic sensor device (e.g., on top of a mask layer) by a physical deposition protocol, such as sputtering. As used herein, the term "applying" refers to placing one or more materials onto a surface, such as for example onto the surface of a substrate. As such, applying may include positioning on top, depositing or otherwise producing a material on a surface. In certain embodiments, applying includes depositing a layer of the passivation mixed oxide material onto a magnetic sensor device. For example, methods may include depositing a thin layer of the mixed oxide passivation material, such as layer having a thickness of 1 nm or more, such as 2 nm or more, such as 5 nm or more, such as 10 nm or more, such as 25 nm or more, such as 50 nm or more, such as 100 nm or more, such as 150 nm or more, such as 200 nm or more, such as 250 nm or more, such as 300 nm or more and including 350 nm or more. In embodiments, the mixed oxide passivation layer material may be applied over the entire surface or a part of the surface, as desired. In some embodiments, applying the mixed oxide passivation layer material to a surface includes depositing material onto less than the entire surface. For instance, applying the mixed oxide passivation layer material to a surface may include depositing the mixed oxide passivation layer material onto 50% or less of the entire surface, such as 40% or less, such as 25% or less, such as 10% or less, such as 5% or less and including 1% or less of the entire surface. In certain instances, applying the mixed oxide passivation layer material to a surface includes depositing the mixed oxide passivation layer material to specific locations on the surface. For example, depositing the mixed oxide passivation layer material to specific locations may include depositing the mixed oxide passivation layer material onto the surface in the form of spots (or any other geometric shape) or strips (e.g., straight or non-straight having regular and irregular patterns).

Any convenient physical deposition sputtering protocol may be employed so long as the physical deposition is not detrimental to the magnetic sensor element (e.g., giant magnetoresistance or tunnel magnetoresistance) sensors, such as where the physical deposition is carried out at excessively high temperatures (e.g., 350° C. or higher) or in the presence of toxic gases. In some embodiments, the mixed oxide passivation layer is produced by sputtering from a mixed oxide sputtering target containing approximately equal atomic percentages of the desired metals (e.g., two or more of zirconium, aluminum, tantalum) as well as a percentage of oxygen to achieve the desired balanced stoichiometry. For example, the mixed sputtering target may include zirconium oxide in an amount that ranges from about 15% by weight to about 65% by weight, such as from about 20% by weight to about 60% by weight and including from about 25% by weight to about 55% by weight; aluminum oxide in an amount that ranges from about 0% by weight to about 25% by weight, such as from about 5% by weight to about 20% by weight, such as from about 10% by weight to about 15% by weight and including from about 12% by weight to about 15% by weight; tantalum oxide in an amount that ranges from about 35% by weight to about 90% by weight, such as from about 40% by weight to about 85% by weight, such as from about 45% by weight to about 80% by weight and including from about 52.5% by weight to about 57.5% by weight. In certain embodiments, the sputtering target includes zirconium oxide in an amount of about 31% by weight; aluminum oxide in an amount of about 13% by weight; and tantalum oxide in an amount of about 56% by weight.

In other embodiments, methods include depositing the passivation layer with a metallic alloy sputtering target having the metals as desired. For example, the metallic alloy sputtering target may include zirconium in an amount that ranges from about 20% by weight to about 50% by weight, such as from about 25% by weight to about 45% by weight and including from about 30% by weight to about 40% by weight; aluminum in an amount that ranges from about 5% by weight to about 25% by weight, such as from about 10% by weight to about 20% by weight, such as from about 10% by weight to about 15% by weight and including from about 12% by weight to about 15% by weight; tantalum in an amount that ranges from about 40% by weight to about 80% by weight, such as from about 45% by weight to about 65% by weight, such as from about 50% by weight to about 60% by weight and including from about 52.5% by weight to about 57.5% by weight. In these embodiments, the mixed oxide passivation layer is formed from the metallic sputtering target through the addition of a small amount of oxygen gas in reactive sputtering.

In embodiments, the composition of the passivation layer contains a substantially pure composition of the mixed oxide material. By "substantially pure" is meant that the composition of the passivation layer contains 99.5% or greater of the mixed oxide material, such as 99.9% or greater, such as 99.99% or greater, such as 99.998% or greater of a single material. As such, the passivation layer includes 0.5% or less of any impurity, such as 0.1% or less, such as 0.05% or less, such as 0.01% or less, such as 0.005% or less, including 0.002% or less of any impurity. By "impurity" is meant any component of the passivation layer composition which is different from the desired passivation layer material and in some instances may be undesirable or is detrimental to the passivation layer composition. For example, impurities may interfere (i.e., diminish) or inhibit a particular desirable property of the passivation layer, such as for example protection from corrosion or resistance to acids/bases. In other embodiments, impurities may be detrimental to the deposition consistency of the passivation layer, such as for example resulting in the passivation layer being unsuitable in thickness or smoothness. Impurities may include, but are not limited to residual moisture, undesired metal constituents (including any aforementioned metals or alloys) or trace materials which may mix with the sputtered material during sputtering deposition.

In some embodiments, the passivation layer is deposited under reduced pressure. By "reduced pressure" is meant that the magnetic sensor device is positioned in a sealed housing which has a pressure below atmospheric pressure. For example, the passivation layer may be applied at a pressure of $10^{-2}$ torr or lower, such as $10^{-3}$, such as $10^{-4}$ torr or lower, such as $10^{-5}$ torr or lower, including as $10^{-6}$ torr or lower. In certain instances, the passivation layer is deposited under a high vacuum. By "high vacuum" is meant that the deposition chamber is evacuated to very low pressures, such as $10^{-7}$ torr or lower, such as $10^{-8}$ torr or lower and including $10^{-10}$ torr or lower. By applying the passivation layer under high vacuum, few impurities and unwanted particles are present during sputter deposition resulting in an extremely high purity passivation layer. In some instances, the pressure of the sample chamber may be adjusted while the passivation layer is deposited. In other words, the pressure may be increased or decreased at any time during the deposition of the passivation layer. For example, in some instances the pressure of the sample chamber may be raised by 0.0000001 torr or more, such as by 0.000001 torr or more, such as by 0.0001 torr or more, such as by 0.001 torr or more, such as by 0.01 torr or more, including 0.1 torr or more. In other instances the pressure of the sample chamber is reduced by 0.0000001 torr or more, such as by 0.000001 torr or more, such as by 0.0001 torr or more, such as by 0.001 torr or more, such as by 0.01 torr or more, including 0.1 torr or more. The pressure of the sample chamber may be adjusted by any convenient method, including but not limited to mechanical roughing pumps, turbomolecular pumps, diffusion pump, among others.

In some embodiments, the passivation layer may be sputter deposited in the presence of a gas composition. In certain instances, the gas composition includes oxygen. In other instances, the gas composition includes an unreactive gas. In still other embodiments, the gas composition includes a mixture of oxygen and the unreactive gas. The term "unreactive gas" is used herein in its conventional sense to refer to a gaseous component which does not result in any type of chemical interaction. For example, suitable unreactive gases may include but are not limited to $N_2$, argon, helium, neon, etc. In some embodiments, the gas composition is an argon gas composition. In other embodiments, the gas composition is an oxygen-argon gas composition. In still other embodiments, the gas composition is an argon-oxygen-nitrogen gas composition. The gas composition may be present at a pressure that varies, such as $10^{-8}$ torr or higher, such as $10^{-7}$ torr or higher, such as $10^{-6}$ torr or higher, such as $10^{-5}$ torr or higher, such as $10^{-4}$ torr or higher, such as $10^{-3}$ torr or higher, such as $10^{-2}$ torr or higher and including $10^{-1}$ torr or higher. In other embodiments, the gas composition is present at atmospheric pressure. In still other embodiments, the gas composition is present at increase pressure, such as 1000 torr or more or more, such as 1100 torr or more, such as 1200 torr or more and including under a pressure of 1500 torr or more.

In some embodiments, deposition of the passivation layer is conducted at room temperature. The term "room temperature" is used in its conventional sense to refer to temperature of the ambient atmosphere, typically ranging between 20 to 25° C. (298K), such as 22° C. If desired, the temperature of the deposition chamber during application of the passivation layer may be adjusted while the passivation layer is deposited. In other words, the temperature may be increased or decreased during deposition of the p layer. For example, in some instances the temperature may be raised by 0.5° C. or more, such as by 1° C. or more, such as by 5° C. or more, such as by 10° C. or more, such as by 15° C. or more, including by 25° C. or more. In other instances the temperature is reduced by 0.5° C. or more, such as by 1° C. or more, such as by 5° C. or more, such as by 10° C. or more, such as by 15° C. or more, including by 25° C. or more.

The thickness of the passivation layer applied (as described above) will depend on the mixed oxide passivation layer material, the rate of deposition, the number of layers applied and the duration of deposition. In some embodiments, the rate of deposition may range, such as from 0.01 to 500 Å/s, such as 0.1 to 250 Å/s, such as 1 to 100 Å/s, such as 10 to 90 Å/s, such as 15 to 75 Å/s, such as 20 to 60 Å/s, including 25 to 50 Å/s. The passivation layer may be applied for 0.5 seconds or longer, such as 1 second or longer, such as 2 seconds or longer, such as 5 seconds or longer, such as 10 seconds or longer, such as 30 seconds or longer, including 60 seconds or longer. One or more layers of mixed oxide passivation material may be applied. For example, two or more layers of mixed oxide passivation material may be applied to the substrate surface, such as three or more layers, such as four or more layers, including 5 or more layers of mixed oxide passivation material may be applied. Additional layers of mixed oxide passivation material may be added to the mixed oxide passivation layer if necessary, such as for example to improve smoothness and uniformity of the passivation layer. For example, if after evaluating the deposited passivation layer, it is determined that the passivation layer is less than optimal or is unsuitable, additional passivation layers may be applied to all or part of the deposited passivation layer. As such, the thickness of the final deposited passivation layer may be 0.1 nm or more, such as 0.5 nm or more, such as 1.0 nm or more, such as 1.5 nm or more, such as 2.0 nm or more, such as 5 nm or more, such as 10 nm or more, including 15 nm or more. The amount of deposited passivation layer material will vary depending on the size of the applied area on the substrate as well as the number of layers deposited. In certain instances, the amount of passivation layer material applied is 100 ng or more, such as 250 ng or more, such as 500 ng or more, such as 1000 ng or more, including 2500 ng or more.

In some embodiments, the magnetic sensor device is moved while applying the passivation layer. By "moved" is meant that movement is applied to the magnetic sensor device in a regular pattern during application of the passivation layer. For example, the magnetic sensor device may be rotated while the passivation layer is applied. In other instances, lateral movement may be applied to the magnetic sensor device during application of the passivation layer.

In certain embodiments, lateral movement is applied to the magnetic sensor device while the passivation layer is deposited. By "lateral movement" is meant the magnetic sensor device is moved in a back and forth motion such that a particular location on the magnetic sensor device may move a predetermined distance, come to a stop and return to its original location. Lateral movement can be made in any direction, such as vertically, horizontally, or any combination thereof (i.e., diagonally with respect to the midline of the magnetic sensor device). The amplitude or total displacement of the substrate may vary. By "amplitude of displacement" or "total displacement" is meant the sum total of distance traversed by a particular location (e.g., midline) on the magnetic sensor device during movement. For example, lateral movement applied to a magnetic sensor device which has a total displacement of 2 mm is meant the location traverses a total of 2 mm during the lateral movement. For example, the location may move 2 mm from the initial location and come to a stop resulting in a 2 mm total displacement or the location may move 1 mm from the initial location and move a second 1 mm to return to its initial location. In embodiments of the present disclosure, lateral movement of the magnetic sensor device when applying the passivation layer may vary, the amplitude of displacement ranging from about 10 to 50 mm, such as from about 15 to 45 mm, such as from about 15 to 40 mm, such as from about 15 to 35, such as from about 20 to 30 mm, including from about 22 to 25 mm. The rate of lateral movement may vary. For example, the back and forth movement of the magnetic sensor device may range from about 1 to 25 times per second, such as 5 to 25 times per second, such as 10 to 20 times per second, including 15 times per second.

In certain instances, the magnetic sensor device is rotated during application of the passivation layer. For example, the magnetic sensor device may be rotated continuously during application. By "rotated continuously" is meant that the substrate rotates either clockwise or counterclockwise without a change in direction at any time during application of the passivation layer. For example, the magnetic sensor device may be rotated continuously in a clockwise direction as the passivation layer is deposited. In other instances, the magnetic sensor device is rotated continuously in a counterclockwise direction as the passivation layer is deposited. The rotation rate of the magnetic sensor device while the passivation layer is deposited may vary, ranging from $1 \times 10^{-3}$ to $1 \times 10^5$ rps (revolutions per second), such as from $5 \times 10^{-2}$ to $1 \times 10^5$ rps, such as from $1 \times 10^{-2}$ to $5 \times 10^4$ rps, such as from $5 \times 10^{-1}$ to $1 \times 10^3$ rps, such as 1 to $5 \times 10^2$ rps, including 5 to 10 rps. Any convenient protocol can be used to rotate the magnetic sensor device while depositing the passivation layer, such as for example by an electric motor, an electromagnetic rotation device, among others.

In other instances, the magnetic sensor device may be rotated in a reciprocating motion. By "reciprocating motion" is meant the substrate is rotated in an alternating fashion such that the magnetic sensor device rotates in one direction (e.g., clockwise) for a first predetermined period of time and changes direction to rotate in the opposing direction (e.g., counterclockwise) for second predetermined period of time. For example, the magnetic sensor device may be rotated in a "back-and-forth" motion, alternating between clockwise and counterclockwise motion. Each direction (e.g., clockwise or counterclockwise) can be performed for any amount of time as desired. For example, the magnetic sensor device may be rotated in either direction for $10^{-3}$ seconds or more, such as $10^{-2}$ seconds or more, such as $10^{-1}$ seconds or more, such as 1 second or more, such as 2 seconds or more, such as 5 seconds or more, such as 10 seconds or more, such as 100 seconds or more, including 500 seconds or more. The rate of rotation in either direction may be the same or different, as desired. The rate of rotation in either direction may be constant (i.e., stays the same throughout application of the passivation layer) or may be variable (i.e., changes at any time during application of the passivation layer). Furthermore, the reciprocating motion may be repeated as desired, such as 2 times or more, such as 5 times or more, such as 10 times or more, such as 50 times or more, such as 100 times or more, such as 1000 times or more, such as 10,000 times or more, including 100,000 times or more.

In some embodiments, methods further include annealing the deposited passivation layer. In some instances, annealing the deposited passivation layer includes thermal annealing. Thermal annealing may be performed on the deposited passivation layer at a temperature that ranges from 10° C. to 200° C., such as from 125° C. to 175° C., such as from 130° C. to 170° C. and including from 140° C. to 160° C. In certain embodiments, the deposited passivation layer is annealed at about 150° C. The deposited passivation layer may be annealed for any suitable amount of time, such as by applying heat from a thermal source for 1 minute or longer, such as 2 minutes or longer, such as 3 minutes or longer, such as 5 minutes or longer, such as 10 minutes or longer, such as 15 minutes or longer, such as 30 minutes or longer, such as 60 minutes or longer and including 120 minutes or longer. Annealing may be performed at atmospheric pressure or at reduced pressure, such as a pressure of $10^{-2}$ torr or lower, such as $10^{-3}$, such as $10^{-4}$ torr or lower, such as $10^{-5}$ torr or lower, including as $10^{-6}$ torr or lower. In certain instances, the passivation layer is annealed under a high vacuum. By "high vacuum" is meant that the deposition chamber is evacuated to very low pressures, such as $10^{-7}$ torr or lower, such as $10^{-8}$ torr or lower and including $10^{-10}$ torr or lower. In other embodiments, the deposited passivation layer is annealed under increased pressure (i.e., greater than atmospheric pressure), such as 1000 torr or more or more, such as 1100 torr or more, such as 1200 torr or more and including under a pressure of 1500 torr or more. Any convenient thermal heat source may be used in the annealing process and include but is not limited to radiative heat sources (e.g., heat lamp, heat gun, etc.) as well as convective heat sources, such as contacting the deposited passivation layer to a heated surface.

Methods may also include monitoring the deposition of the passivation layer. By "monitoring" is meant that one or more properties of the passivation layer are determined and assessed in conjunction with or after deposition. Furthermore, monitoring may also include assessing/maintaining operating parameters of the deposition process such as for example, configuration and angle of deposition, magnetic sensor device movement, deposition temperature as well as deposition chamber pressure.

In some embodiments, methods include determining the chemical makeup of passivation layer (e.g., percentage of each metal oxide component). Determining the chemical makeup refers to the analysis of one or more of the chemical properties or components present in the passivation layer. Determining the makeup of the passivation layer may include, but is not limited to determining the chemical makeup (e.g., metal composition, amount of impurity), electrochemical properties, spectroscopic properties, etc of the passivation layer. Any convenient protocol can be employed to determine the makeup of the passivation layer. Methods for analyzing the makeup of the passivation layer include, but are not limited to IR spectroscopy, UV-vis spectrophotometry, visible microscopy, electron microscopy among other analytical protocols.

In other embodiments, methods include determining the physical makeup of the passivation layer. Determining the physical makeup refers to the analysis of one or more physical parameters of the passivation layer. For example, the amount of material deposited, thickness, smoothness and uniformity of different parts of the passivation layer (e.g., thickness disposed on top of the mask layer, thickness on top of the substrate recess, thickness of passivation layer that extends from the top of the mask layer to the substrate surface, i.e., the part that covers the edge of the magnetic sensor elements) may be assessed. Any convenient protocol can be employed to determine the physical makeup of the passivation layer. Methods for analyzing the physical makeup of the passivation layer include, but are not limited to quartz crystal microbalance, visible microscopy, electron microscopy, surface reflection analysis, contact angle studies, among others.

The deposition of the passivation layer may be monitored at any phase during the subject methods. For example, the makeup of the passivation layer may be determined immediately after deposition, respectively. In other embodiments, the makeup of the passivation is determined throughout the deposition process. For instances, data (i.e., thickness, conductivity, impurity content, etc.) about the passivation layer may be monitored throughout the deposition process, such by real-time data collection. In other embodiments, the passivation layer is monitored during the deposition process by collecting data at regular intervals, e.g., collecting data every 1 minute, every 5 minutes, every 10 minutes, every 30 minutes, every 60 minutes, every 100 minutes, every 200 minutes, every 500 minutes, or some other interval.

Methods of the present disclosure also include assessing the collected data. By "assessing" the collected data is meant that a human (either alone or with the assistance of a computer, if using a computer automated process initially set up under human direction), evaluates the collected data about the passivation layer and determines whether the layer is suitable or unsuitable. In other words, methods of these embodiments include a step of assessing the collected data to identify any desired adjustments to the passivation layer. The desired adjustments may vary in terms of goal, where in some instances the desired adjustments that ultimately result in enhanced efficiency of some desirable parameter, e.g., smoothness, uniformity, thickness, corrosion resistance as well as resistance to acids/bases. In some instances, where the passivation layer has been determined to be at least less than optimal, that layer may be further processed. If necessary, the passivation layer may be processed at more than one time during methods of the present disclosure.

In certain embodiments, processing may include adjusting the thickness of the deposited passivation layer. For instance, processing the passivation layer may include increasing the thickness of the deposited layer, such as by 0.1 nm or more, such as 0.5 nm or more, such as 1.0 nm or more, such as 1.5 nm or more, such as 2.0 nm or more, such as 5 nm or more, including 10 nm or more. The thickness of part or all of each layer maybe adjusted. For example, in some embodiments, methods include increasing the thickness of the entire deposited passivation layer. In other embodiments, less than that entire deposited passivation layer may be increased in thickness, such as 95% or less of the deposited layer is increased in thickness, such as 75% or less, such as 50% or less, such as 25% or less, such as 10% or less, and including 5% or less of the passivation layer is increased in overall thickness. In certain instances, specific regions on the deposited passivation layer may be adjusted (e.g., the part of the passivation layer deposited on top of the mask layer, the part of the passivation layer deposited on top of the substrate recess, the part of the passivation layer that extends from the top of the mask layer to the substrate surface, i.e., the part that covers the edge of the magnetic sensor elements) resulting in the discrete portions of the passivation layer having varying thickness.

In other embodiments, processing may include adjusting the smoothness of the deposited passivation layer. For instance, processing the passivation layer may include improving the smoothness of the deposited layer. As such, all or a portion of the deposited layer may be processed to improve the smoothness of the deposited layer. In some instances, discrete positions on the deposited layer may be targeted for improving smoothness.

Magnetic Sensor Devices

Aspects of the present disclosure include magnetic sensor devices. The magnetic sensor device includes a support. In some embodiments, the support includes an array of magnetic sensors (e.g., an array of biosensors) disposed thereon. In certain embodiments, each magnetic sensor includes a passivation layer (e.g., mixed oxide passivation layer, encapsulating passivation layer) as described herein. Aspects of the magnetic sensors are described further in the following sections.

In embodiments, the magnetic sensor devices include one or more magnetic sensor elements, such as 2 or more, such as 3 or more, such as 4 or more, such 5 or more and including 10 or more. The magnetic sensor elements may be arranged (e.g., arranged in series and/or in parallel as described above) such that the distance between adjacent magnetic sensor elements is 50 µm or less, such as 40 µm or less, including 30 µm or less, or 20 µm or less, or 10 µm or less, or 5 µm or less, or 4 µm or less, or 3 µm or less, or 2 µm or less, or 1 µm or less. In some cases, the distance between adjacent magnetic sensor elements is 2 µm.

In certain embodiments, each magnetic sensor element may have dimensions in the range of 2 µm×2 µm to 200 µm×200 µm, including dimensions of 2 µm×200 µm or less, such as 100 µm×2 µm or less, for instance 2 µm×100 µm or less, or 100 µm×100 µm or less, or 10 µm×10 µm or less, or 5 µm×5 µm or less, or 3 µm×3 µm or less, or 2 µm×2 µm or less, or 1 µm×1 µm or less.

In certain embodiments, an electrode may have dimensions in the range of 2 µm×2 µm to 200 µm×200 µm, including dimensions of 2 µm×200 µm or less, such as 100

μm×2 μm or less, for instance 2 μm×100 μm or less, or 100 μm×100 μm or less, or 10 μm×10 μm or less, or 5 μm×5 μm or less, or 3 μm×3 μm or less, or 2 μm×2 μm or less, or 1 μm×1 μm or less. In some instances, an electrode (e.g., a top electrode) has dimensions of 150 μm×10 μm or less, or 120 μm×5 μm or less, or 120 μm×2.8 μm or less, or 100 μm×2.8 μm or less, or 75 μm×2.8 μm or less, or 50 μm×2.8 μm or less, or 25 μm×2.8 μm or less, or 10 μm×2.8 μm or less, such as 2.0 μm×2.8 μm. In some instances, an electrode (e.g., a bottom electrode) has dimensions of 150 μm×10 μm or less, or 125 μm×5 μm or less, or 124 μm×2.6 μm or less, or 100 μm×2.6 μm or less, or 75 μm×2.6 μm or less, or 50 μm×2.6 μm or less, or 25 μm×2.6 μm or less, or 10 μm×2.8 μm or less, such as 6.8 μm×2.6 μm.

In certain embodiments, an electrode is composed of an electrically conductive material. In some cases, the electrode is made of a conductive metal, e.g., copper, aluminum, palladium, a palladium alloy, a palladium oxide, platinum, a platinum alloy, a platinum oxide, ruthenium, a ruthenium alloy, a ruthenium oxide, silver, a silver alloy, a silver oxide, tin, a tin alloy, a tin oxide, titanium, a titanium alloy, a titanium oxide, tantalum, a tantalum alloy, a tantalum oxide, combinations thereof, and the like. In some instances, the electrode is made of tantalum. In some instances, the electrode is made of ruthenium. In some instances, the electrode includes a layer of an electrically conductive material as described above. For example, the electrode may include a layer of a conductive metal, such as tantalum. In some instances, the electrode includes two or more layers of electrically conductive materials as described above. For example, the electrode may include alternating layers of two different conductive metals, such as tantalum and ruthenium. In some instances, the thickness of the electrode ranges from 1 nm to 1000 nm, such as from 1 nm to 500 nm, or 1 nm to 250 nm, or 1 nm to 100 nm, or 1 nm to 75 nm, or 1 nm to 50 nm, or 1 nm to 45 nm, or 1 nm to 40 nm, or 1 nm to 35 nm, or 1 nm to 30 nm, or 1 nm to 25 nm, or 1 nm to 20 nm, or 1 nm to 15 nm, or 1 nm to 10 nm, or 1 nm to 5 nm. In some embodiments, the thickness of the electrode ranges from 1 nm to 30 nm, such as a thickness of 30 nm, or 20 nm, or 10 nm.

In certain embodiments, a magnetic sensor includes a plurality of MTJ elements. In some cases, the magnetic sensor includes two or more MTJ elements (e.g., two or more MTJ elements arranged in series), as described above. In some instances, the magnetic sensor device includes MTJ elements arranged in series and additional MTJ elements electrically connected in parallel to the first series of MTJ sensor arrays. The additional MTJ elements may include two or more MTJ elements arranged in series as described above. As such, in certain cases, the magnetic sensor may include an arrangement of MTJ elements where a plurality of MTJ elements are electrically connected both in series and in parallel.

Aspects of the present disclosure include a magnetic sensor device, where the magnetic sensor device includes a support. In some embodiments, the support includes an array of magnetic sensors (e.g., an array of biosensors) disposed thereon. In certain embodiments, the support has a thickness of 5 mm or less, such as 2 mm or less, including 1.6 mm or less, or 1.0 mm or less, or 0.5 mm or less, or 0.3 mm or less, or 0.2 mm or less. In certain embodiments, the support has a width of 20 mm or less, or 15 mm or less, such as 12 mm or less, including 10 mm or less, or 5 mm or less, or 2 mm or less.

In certain embodiments, the support of the magnetic sensor device is shaped as a rectangular solid (although other shapes are possible), having a length ranging from 1 mm to 20 mm, such as 1 mm to 10 mm, including 1 mm to 5 mm; a width ranging from 1 mm to 20 mm, such as 1 mm to 10 mm, including 1 mm to 5 mm, or 1 mm to 3 mm; and a thickness ranging from 0.1 mm to 5 mm, such as 0.2 mm to 1 mm, including 0.3 mm to 0.5 mm.

Magnetic Sensor Arrays

In certain embodiments, the magnetic sensor device includes an array of magnetic sensors (e.g., an array of biosensors). The array of magnetic sensors may have a variety of different configurations, e.g., with respect to magnetic sensor configuration. In certain embodiments, the subject magnetic sensors are arranged on a biochip (e.g., a biosensor chip). By "biochip" or "biosensor chip" is meant a magnetic sensor device that includes an array of magnetic sensors (e.g., an array of biosensors). For instance, a biochip may include a magnetic sensor device that includes a support surface which displays two or more distinct arrays of magnetic sensors on the support surface. In certain embodiments, the magnetic sensor device includes a support surface with an array of magnetic sensors.

An "array" includes any two-dimensional or substantially two-dimensional (as well as a three-dimensional) arrangement of addressable regions, e.g., spatially addressable regions. An array is "addressable" when it has multiple sensors positioned at particular predetermined locations (e.g., "addresses") on the array. Array features (e.g., sensors) may be separated by intervening spaces. Any given support may carry one, two, four or more arrays disposed on a front surface of the support. Depending upon the use, any or all of the arrays may be the same or different from one another and each may contain multiple distinct magnetic sensors. An array may contain one or more, including 2 or more, 4 or more, 8 or more, 10 or more, 50 or more, 100 or more, 250 or more, 500 or more, 750 or more, 1000 or more magnetic sensors. For example, 64 magnetic sensors can be arranged into an 8×8 array, or 80 magnetic sensors can be arranged in an 8×10 array, or 90 sensors can be arranged in a 9×10 array.

In some instances, the magnetic sensors are arranged in the array in rows and columns of magnetic sensors. For example, an array may include one or more rows of two or more magnetic sensors. In some cases, an array includes 1 or more rows, such as 2 or more, or 3 or more, or 4 or more, or 5 or more, or 6 or more, or 7 or more, or 8 or more, or 9 or more, or 10 or more, or 12 or more, or 14 or more, or 16 or more, or 18 or more, or 20 or more, or 25 or more, or 30 or more, or 35 or more, or 40 or more, or 45 or more, or 50 or more rows of magnetic sensors. In some cases, an array includes 1 or more columns, such as 2 or more, or 3 or more, or 4 or more, or 5 or more, or 6 or more, or 7 or more, or 8 or more, or 9 or more, or 10 or more, or 12 or more, or 14 or more, or 16 or more, or 18 or more, or 20 or more, or 25 or more, or 30 or more, or 35 or more, or 40 or more, or 45 or more, or 50 or more columns of magnetic sensors. For example, 64 magnetic sensors can be arranged into an 8×8 array that includes 8 rows and 8 columns of magnetic sensors, or 80 magnetic sensors can be arranged in an 8×10 array that includes 10 rows and 8 columns of magnetic sensors.

In certain embodiments, the magnetic sensors can be arranged into an array with an area of 10 $cm^2$ or less, or 9 $cm^2$ or less, 5 $cm^2$ or less, 4 $cm^2$ or less, e.g., 2 $cm^2$ or less, 1.2 $cm^2$ or less, 0.1 $cm^2$ or less, including 50 $mm^2$ or less, 20 $mm^2$ or less, such as 10 $mm^2$ or less, or even smaller. For example, the magnetic sensors can be arranged into an array with an area of 15 mm$^2$ or less, such as 12.2 mm$^2$ or less (e.g., 3.2 mm×3.8 mm). In some instances, the magnetic sensors are arranged into an array with an area of 20 mm$^2$. For instance, the magnetic sensors may have a density in an array of 1 magnetic sensor per 2 mm$^2$ array area or less, such as 1 magnetic sensor per 1 mm$^2$ array area or less, or 1 magnetic sensor per 0.5 mm$^2$ array area, or 1 magnetic sensor per 0.2 mm$^2$ array area, or 1 magnetic sensor per 0.16 mm$^2$ array area, or 1 magnetic sensor per 0.14 mm$^2$ array area, or 1 magnetic sensor per 0.12 mm$^2$ array area, or 1 magnetic sensor per 0.1 mm$^2$ array area, or 1 magnetic sensor per 0.08 mm$^2$ array area, or 1 magnetic sensor per 0.05 mm$^2$ array area. In some cases, the magnetic sensors may have a density in an array of 1 magnetic sensor per 0.16 mm$^2$ array area.

In some embodiments, magnetic biosensors with multiple MTJ elements, according to the embodiments of the present disclosure, are dimensioned to cover a portion of the support which is contacted with a sample of biological molecules during an assay. The placement of the sample (e.g., biological molecules) onto individual sensors may be performed by placing small droplets of a liquid sample with biological molecules onto certain regions of the support, or by placing a stamp coated with biological molecules into contact with the support. In some embodiments, the area of the support coated by a sample of biological molecules and the area of a biosensor are substantially similar. For example, the biosensor may have dimensions in the range of 10 μm×10 μm to 1000 μm×1000 μm, including dimensions of 10 μm×1000 μm or less, such as 1000 μm×10 μm or less, for instance 800 μm×800 μm or less, or 400 μm×400 μm or less, or 200 μm×200 μm or less, or 180 μm×180 μm or less, or 160 μm×160 μm or less, or 140 μm×140 μm or less, or 120 μm×120 μm or less, or 100 μm×100 μm or less, or 80 μm×80 μm or less, or 50 μm×50 μm or less, or 30 μm×30 μm or less. In some instances, a biosensor has dimensions of 140 μm×140 μm or less, such as 120 μm×120 μm.

In some embodiments, magnetic biosensors with multiple MTJ elements, according to the embodiments of the present disclosure, are spaced apart such that the number of biosensors per unit area is maximized, while still allowing individual biosensors to be contacted with separate droplets of a liquid sample containing biological molecules. To achieve substantial separation between adjacent droplets of liquid placed onto individual biosensors, the biosensors may be spaced a certain distance apart. In some instances, the intervening spaces between adjacent biosensors are an inert, non-sensing area between adjacent biosensors. In some embodiments, this inert area between adjacent biosensors may cover a distance of 1 to 5 times the size of the biosensors. For example, if the biosensor covers an area of 100 μm×100 μm, then the inert area between adjacent biosensors may cover a distance ranging from 100 μm to 500 μm. As discussed above, in some instances, the biosensors have dimensions of 120 μm×120 μm. In some embodiments, the biosensors may be arranged in regular intervals of 400 μm (as measured from the center of a biosensor to the center of the adjacent biosensor), so that the inert space between adjacent biosensors is approximately 280 μm in length.

In certain embodiments, at least some, or all, of the magnetic sensors have an analyte-specific probe (e.g., a surface capture ligand) stably associated with a surface of the sensor. For example, each magnetic sensor array may include one or more magnetic sensors having an analyte-specific probe bound to a surface of the magnetic sensor. Where a given array includes two or more magnetic sensors, each sensor may have the same or different analyte-specific probe associated with its surface. For example, a magnetic sensor array may include two or more distinct magnetic sensors each configured to specifically detect the same analyte. In some cases, different analyte-specific probes may be present on the sensor surfaces of such devices, such that each different analyte-specific probe specifically binds to a distinct analyte. For instance, a magnetic sensor array may include two or more distinct magnetic sensors each configured to specifically detect a different analyte. In other cases, the magnetic sensor devices include magnetic sensors that are free of any analyte-specific probes, such that the surface of the magnetic sensor is functionalized to bind directly to the analyte. In some instances, the magnetic sensor includes a blocking layer disposed over the surface of the magnetic sensor. The blocking layer may be configured to inhibit the binding of any analyte-specific probes or analyte to the surface of the magnetic sensor (e.g., where such blocked magnetic sensors may serve as sources of reference or control electrical signals).

As described above, in certain embodiments, the magnetic sensor device includes two or more magnetic sensor arrays disposed on a substrate. As such, the magnetic sensor device includes two or more magnetic sensor arrays. As described above, each magnetic sensor array may have one or more magnetic sensors with each magnetic sensor configured to detect the same or different analytes. Thus, each magnetic sensor array on the magnetic sensor device may be configured to detect the same set or different sets of analytes. For example, a magnetic sensor device may include two or more distinct magnetic sensor arrays each configured to specifically detect the same set of analytes. In other cases, a magnetic sensor device may include two or more distinct magnetic sensors each configured to specifically detect a different set of analytes.

In certain embodiments, areas in between the magnetic sensors in an array may be present which do not carry any analyte-specific probes or are not functionalized to bind directly to the analyte. Such inter-sensor areas, when present, may be of various sizes and configurations. In some instances, these inter-sensor areas may be configured to inhibit or prevent fluid movement among different sensors, e.g., where the inter-sensor areas are coated with hydrophobic materials and/or fluid barriers, such as walls.

Electronic communication elements, e.g., conductive leads, may be present which are configured to electronically couple the magnetic sensors to components of the system, such as processors, displays, etc. Additionally, a given magnetic sensor device may include a variety of other components in addition to the magnetic sensor array. Additional magnetic sensor device components may include, but are not limited to: signal processing components, power sources, fluid handling components, wired or wireless communication components, etc.

In certain embodiments, the magnetic sensor device is configured to produce a detectable signal from a minimum amount of sample. In some instances, the magnetic sensor device is configured to produce a detectable signal from a sample size of 10 mL or less, or 5 mL or less, or 3 mL or less, or 1 mL or less, such as 500 μL or less, including 100 μL or less, for example 50 μL or less, or 25 μL or less, or 10 μL or less. As such, in some cases, the fluid reservoirs of the reservoir plate may be configured to receive a minimum amount of sample needed to produce a detectable signal. For example, the fluid reservoirs may be configured to receive a sample of 10 mL or less, or 5 mL or less, or 3 mL or less, or 1 mL or less, such as 500 μL or less, including 100 μL or less, for example 50 μL or less, or 25 μL or less, or 10 μL or less, or 5 μL or less, or 1 μL or less.

In some embodiments, the magnetic sensor device is configured to connect to a system for detecting the presence of an analyte in a sample. Accordingly, in certain embodiments, the magnetic sensor device does not include a magnetic field source. The magnetic field source may be included in the system for detecting the presence of an analyte in the sample and, thus not included in the magnetic sensor device. Thus, the assay protocol may include operably coupling the magnetic sensor device to the system for detecting the presence of an analyte in the sample. In some instances, the magnetic sensor device may be operably coupled to an activation and signal processing unit of the system, as described herein. The magnetic sensor device may include one or more electrical contacts configured to electrically connect the magnetic sensor device to the system, such as to the activation and signal processing unit of the system. The electrical contacts may be arranged along an edge of the magnetic sensor device.

In certain embodiments, the magnetic sensor device includes a programmable memory. In some cases, the programmable memory is configured to store information, such as information including, but not limited to: calibration data (e.g., calibration data for each magnetic sensor and/or each magnetic sensor array);
a record of how the magnetic sensors have been prepared with surface functionalization molecules prior to the assay; a record of completed assay steps; a record about which sample was measured; a record of the measurement results; and the like. In some instances, a barcode may be used instead of, or in addition to, the programmable memory. In embodiments of the magnetic sensor device that include a barcode, information associated with the magnetic sensor device may be stored and retrieved from an information system separate from the magnetic sensor device, such as the activation and signal processing unit of the system.

Magnetic Sensors

As described above, each magnetic sensor may include one or more magnetic sensor elements. In some cases, magnetic sensors are sensors configured to detect the presence of nearby magnetic labels without any direct physical contact between the magnetic sensor and the magnetic label. In certain embodiments, the magnetic sensors are configured to detect the presence of an analyte in a sample. For example, a magnetic label may be bound, either directly or indirectly, to an analyte, which in turn may be bound, either directly or indirectly, to the magnetic sensor. If the bound magnetic label is positioned within the detection range of the magnetic sensor, then the magnetic sensor may provide a signal indicating the presence of the bound magnetic label, and thus indicating the presence of the analyte.

In some instances, the magnetic sensors have a detection range from 1 nm to 1000 nm from the surface of the magnetic sensor, such as from 1 nm to 800 nm, including from 1 nm to 500 nm, such as from 1 nm to 300 nm, including from 1 nm to 100 nm from the surface of the magnetic sensor. In some instances, a minimization of the detection range of the sensors may facilitate detection of specifically bound analytes while minimizing detectable signals from analytes not of interest. By "detection range" is meant the distance from the surface of the magnetic sensor where the presence of a magnetic label will induce a detectable signal in the magnetic sensor. In some cases, magnetic labels positioned close enough to the surface of the magnetic sensor to be within the detection range of the magnetic sensor will induce a detectable signal in the magnetic sensor. In certain instances, magnetic labels positioned at a distance from the surface of the magnetic sensor that is greater than the detection range of the magnetic sensor will not induce a detectable or non-negligible signal in the magnetic sensor. For example, a magnetic label may have a magnetic flux that is proportional to $1/r^3$, where r is the distance between the magnetic sensor and the magnetic label. Thus, only those magnetic labels that are positioned in close proximity (e.g., within the detection range of the magnetic sensor) will induce a detectable signal in the magnetic sensor.

In certain embodiments, the surface of the magnetic sensor is functionalized to bind directly to an analyte or a magnetic label. For example, the surface of the magnetic sensor may be functionalized to provide for covalent binding or non-covalent association between the analyte or the magnetic label and magnetic sensor, including, but not limited to, non-specific adsorption, binding based on electrostatic interactions (e.g., ion-ion pair interactions), hydrophobic interactions, hydrogen bonding interactions, and the like.

In some instances, the surface of the magnetic sensor or the inter-element area includes an analyte-specific probe (e.g., a surface capture ligand) that specifically binds to an analyte. The analyte-specific probe may be bound to the surface of the magnetic sensor or the inter-element area. For instance, a cationic polymer such as polyethyleneimine (PEI) can be used to nonspecifically bind charged antibodies to the surface via physiabsorption. Alternatively, a covalent chemistry can be used utilizing free amines or free thiol groups on the analyte-specific probe to covalently bind the analyte-specific probe to the surface of the magnetic sensor or the inter-element area. For example, an N-hydroxysuccinimide (NHS) to 1-ethyl-3-(3-dimethylaminopropyl) carbodiimide (EDC) coupling system may be used to covalently bind the analyte-specific probe to the surface of the magnetic sensor or the inter-element area.

The analyte-specific probe may include one member of a specific binding pair. For example, suitable specific binding pairs include, but are not limited to: a member of a receptor/ligand pair; a ligand-binding portion of a receptor; a member of an antibody/antigen pair; an antigen-binding fragment of an antibody; a hapten; a member of a lectin/carbohydrate pair; a member of an enzyme/substrate pair; biotin/avidin; biotin/streptavidin; digoxin/antidigoxin; and the like. In certain embodiments, the surface of the magnetic sensor or the inter-element area includes an antibody that specifically binds to an analyte of interest. Accordingly, contacting the magnetic sensor or the inter-element area with an assay composition that includes the analyte of interest may result in binding of the analyte to the analyte-specific probe (e.g., antibody) bound to the surface of the magnetic sensor or the inter-element area.

In certain embodiments, the magnetic sensor is configured to generate an electrical signal in response to a magnetic label in proximity to a surface of the magnetic sensor. For example, the magnetic sensors may be configured to detect changes in the resistance of the magnetic sensor induced by changes in the local magnetic field. In some cases, binding of a magnetic label (e.g., a magnetic nanoparticle label) in close proximity to the magnetic sensor, as described above, induces a detectable change in the resistance of the magnetic sensor. For instance, in the presence of an applied external magnetic field, the magnetic labels near the magnetic sensor may be magnetized. The local magnetic field of the magnetized magnetic labels may induce a detectable change in the resistance of the underlying magnetic sensor. Thus, the presence of the magnetic labels can be detected by detecting changes in the resistance of the magnetic sensor. In certain embodiments, the magnetic labels near the magnetic sensor may be present in an inter-element area such as bound to an inter-element area as described herein. In certain embodiments, the magnetic labels near the magnetic sensor may be present in an inter-element area such as bound to a side surface of a magnetic sensor element as described herein.

In certain embodiments, the magnetic sensors are configured to detect changes in resistance of 1 Ohm or less, such as 500 mOhm or less, including 100 mOhm or less, or 50 mOhm or less, or 25 mOhm or less, or 10 mOhm or less, or 5 mOhm or less, or 1 mOhm or less. In certain embodiments, the change in resistance may be expressed in parts per million (PPM) relative to the original sensor resistance, such as a change in resistance of 2 PPM or more, or 20 PPM or more, or 200 PPM or more, or 400 PPM or more, or 600 PPM or more, or 1000 PPM or more, or 2000 PPM or more, or 4000 PPM or more, or 6000 PPM or more, or 10,000 PPM or more, or 20,000 PPM or more, or 40,000 PPM or more, or 60,000 PPM or more, or 100,000 PPM or more, or 200,000 PPM or more.

In certain cases, the magnetic sensor is a multilayer thin film structures. The sensors may include alternating layers of a ferromagnetic material and a nonmagnetic material. The ferromagnetic material may include, but is not limited to, Permalloy (NiFe), iron cobalt (FeCo), nickel iron cobalt (NiFeCo), nickel oxide (NiO), cobalt oxide (CoO), nickel cobalt oxide (NiCoO), ferric oxide ($Fe_2O_3$), CoFeB, Ru, PtMn, combinations thereof, and the like. In some cases, the non-magnetic material is an insulating layer, such as, but not limited to, MgO, alumina, and the like. In certain embodiments, the ferromagnetic layers have a thickness of 1 nm to 10 nm, such as 2 nm to 8 nm, including 3 nm to 4 nm. In some instances, the non-magnetic layer has a thickness of 0.2 nm to 5 nm, such as 1 nm to 3 nm, including 1.5 nm to 2.5 nm, or 1.8 nm to 2.2 nm.

Spin Valve Magnetoresistive Elements

In certain embodiments, the magnetic sensor element is a spin valve magnetoresistive element. In certain cases, the spin valve element is a multilayer structure that includes a first ferromagnetic layer, a non-magnetic layer disposed on the first ferromagnetic layer, and a second ferromagnetic layer disposed on the non-magnetic layer. The first ferromagnetic layer may be configured to have its magnetization vector fixed in a certain direction. In some cases, the first ferromagnetic layer is called the "pinned layer". In certain embodiments, the spin valve element includes a pinned layer with a magnetization substantially parallel to a width of the magnetic sensor element, as described above. The second ferromagnetic layer may be configured such that its magnetization vector can rotate freely under an applied magnetic field. In some cases, the second ferromagnetic layer is called the "free layer".

In certain instances, the electrical resistance of a spin valve element depends on the relative orientation of the magnetization vector of the free layer to that of the pinned layer. When the two magnetization vectors are parallel, the resistance is the lowest; when the two magnetization vectors are antiparallel, the resistance is the highest. The relative change of resistance is called the magnetoresistance (MR) ratio. In certain embodiments, a spin valve element has a MR ratio of 1% to 20%, such as 3% to 15%, including 5% to 12%. In some cases, the MR ratio of a spin valve element is 10% or more in a small magnetic field, e.g., 100 Oe. Changes in the resistance of the spin valve element due to the presence of magnetic labels near the surface of the spin valve element may be detected, as described above.

In certain embodiments, the signal from the spin valve element due to the magnetic label depends on the distance between the magnetic label and the free layer of the spin valve element. In some cases, the voltage signal from a magnetic label decreases as the distance from the center of the magnetic label to the mid-plane of the free layer increases. Thus, in certain instances, the free layer in the spin valve element is positioned at the surface of the spin valve element. Positioning the free layer at the surface of the spin valve element may minimize the distance between the free layer and any bound magnetic labels, which may facilitate detection of the magnetic labels.

In certain embodiments, the spin valve element may include a passivation layer disposed on one or more of the spin valve element surfaces. In some cases, the passivation layer has a thickness of 60 nm or less, such as 50 nm or less, including 40 nm or less, 30 nm or less, 20 nm or less, 10 nm or less. For instance, the passivation layer may have a thickness of 1 nm to 10 nm, such as from 1 nm to 5 nm, including from 1 nm to 3 nm. In certain embodiments, the passivation layer includes gold, tantalum, $SiO_2$, $Si_3N_4$, combinations thereof, and the like.

Magnetic Tunnel Junction (MTJ) Magnetoresistive Elements

In certain embodiments, the magnetic sensor element is a magnetic tunnel junction (MTJ) magnetoresistive element (also referred to herein as an MTJ element). In some cases, the MTJ element includes a multilayer structure that includes a first ferromagnetic layer, an insulating layer disposed on the first ferromagnetic layer, and a second ferromagnetic layer disposed on the insulating layer. The insulating layer may be a thin insulating tunnel barrier, and may include alumina, MgO, and the like. In some cases, electron tunneling between the first and the second ferromagnetic layers depends on the relative magnetization of the two ferromagnetic layers. For example, in certain embodiments, the tunneling current is high when the magnetization vectors of the first and second ferromagnetic layers are parallel and the tunneling current is low when the magnetization vectors of the first and second ferromagnetic layers antiparallel.

In some instances, a MTJ element has a magnetoresistance ratio (MR) of 1% to 300%, such as 10% to 250%, including 25% to 200%. Changes in the resistance of the MTJ element due to the presence of magnetic labels near the surface of the MTJ element may be detected, as described above. In some instances, the MTJ element has an MR of 50% or more, or 75% or more, or 100% or more, or 125% or more, or 150% or more, or 175% or more, or 200% or more, or 225% or more, or 250% or more, or 275% or more, or 200% or more. For instance, the MTJ element may have an MR of 225% or more.

In certain embodiments, the second ferromagnetic layer (e.g., the layer of the MTJ element positioned at the surface of the MTJ element) includes two of more layers. For example, the second ferromagnetic layer may include a first layer, a second layer disposed on the first layer, and a third layer disposed on the second layer. In some cases, the first layer is a thin ferromagnetic layer (e.g., NiFe, CoFe, CoFeB, and the like). The thin metallic layer may have a thickness of 6 nm or less, such as 5 nm or less, including 4 nm or less, 3 nm or less, 2 nm or less, or 1 nm or less, or 0.5 nm or less. The second layer may include a conductive metal, e.g., copper, aluminum, palladium, a palladium alloy, a palladium oxide, platinum, a platinum alloy, a platinum oxide, ruthenium, a ruthenium alloy, a ruthenium oxide, silver, a silver alloy, a silver oxide, tin, a tin alloy, a tin oxide, titanium, a titanium alloy, a titanium oxide, tantalum, a tantalum alloy, a tantalum oxide, combinations thereof, and the like. The second layer may have a thickness of 2 nm or less, such as 0.5 nm or less, including 0.4 nm or less, 0.3 nm or less, 0.2 nm or less, or 0.1 nm or less. The third layer may include a ferromagnetic material such as, but not limited to, NiFe, CoFe, CoFeB, and the like. The third layer may have a thickness of 6 nm or less, such as 5 nm or less, including 4 nm or less, 3 nm or less, 2 nm or less, or 1 nm or less, or 0.5 nm or less.

In some cases, the MTJ element is configured such that the distance between an associated magnetic label and the top surface of the free layer ranges from 5 nm to 1000 nm, or 10 nm to 800 nm, such as from 20 nm to 600 nm, including from 40 nm to 400 nm, such as from 60 nm to 300 nm, including from 80 nm to 250 nm.

The MTJ element may include a passivation layer disposed on one or more of the MTJ element surfaces. In some instances, the passivation layer has a thickness of 60 nm or less, such as 50 nm or less, including 40 nm or less, 30 nm or less, 20 nm or less, 10 nm or less. For example, the passivation layer may have a thickness of 1 nm to 50 nm, such as from 1 nm to 40 nm, including from 1 nm to 30 nm, or form 1 nm to 20 nm. In some instances, the passivation layer has a thickness of 30 nm. In some cases, the passivation layer includes gold, tantalum, a tantalum alloy, a tantalum oxide, aluminum, an aluminum alloy, an aluminum oxide, $SiO_2$, $Si_3N_4$, $ZrO_2$, combinations thereof, and the like. In certain embodiments, a passivation layer with a thickness as described above facilitates a maximization in signal detected from magnetic labels specifically bound to the sensor surface or the inter-element area while minimizing the signal from magnetic labels that are not specifically bound.

In certain embodiments, a MTJ element has dimensions ranging from 1 μm×1 μm to 200 μm×200 μm, including dimensions of 1 μm×200 μm or less, such as 200 μm×1 μm or less, for instance 150 μm×10 μm or less, or 120 μm×5 μm or less, or 120 μm×0.8 μm or less, or 0.8 μm×120 μm or less, or 100 μm×0.7 μm or less, or 100 μm×0.6 μm or less, or 100 μm×0.5 μm or less, or 10 μm×0.6 μm or less, or 10 μm×0.5 μm or less. In some instances, a MTJ element has dimensions of 120 μm×0.8 μm or less, such as 2.0 μm×0.8 μm.

Magnetic tunnel junction (MTJ) detectors are further described in U.S. Application Publication No. 2009/0104707, filed Sep. 19, 2008, the disclosure of which is hereby incorporated by reference in its entirety. Detectors are further described in U.S. Pat. No. 7,906,345, filed Apr. 22, 2004, the disclosure of which is hereby incorporated by reference in its entirety.

Magnetic Sensing Areas

In certain embodiments, the magnetic sensor device may be configured to include one or more magnetic sensing areas. A magnetic sensing area may correspond to the area of the device where an array of magnetic sensors (e.g., an array of biosensors) is positioned. For instance, the magnetic sensing area may be an area on the surface of the device that is exposed to the sample during use, and which has an array of magnetic sensors (e.g., an array of biosensors) as described above.

The magnetic sensing area may be configured to include a fluid reservoir. The fluid reservoir may be any of a variety of configurations, where the fluid reservoir is configured to hold a sample in contact with the magnetic sensor arrays. Accordingly, configurations of the fluid reservoirs may include, but are not limited to: cylindrical well configurations, square well configurations, rectangular well configurations, round bottom well configurations, and the like. For instance, the fluid reservoirs may include walls that separate one fluid reservoir from adjacent fluid reservoirs. The walls may be substantially vertical with respect to the surface of the reservoir plate. In some cases, the walls of each fluid reservoir define a volume of space that may receive a volume of sample equal to or less than the volume of space defined by the fluid reservoir.

In certain embodiments, a fluid reservoir has a volume of 10 mL or less, or 5 mL or less, or 3 mL or less, or 1 mL or less, such as 500 μL or less, including 100 μL or less, for example 50 μL or less, or 25 μL or less, or 10 μL or less, which is sufficient to contain a sample volume of an equal or lesser volume.

Magnetic Sensor Systems

In certain embodiments, the systems include a magnetic sensor device, and a magnetic field source. The magnetic sensor device includes a support having two or more arrays of magnetic sensors (e.g., arrays of biosensors) positioned thereon. The system may be configured to obtain signals from each array of magnetic sensors indicating whether one or more analytes is present in each sample.

In certain embodiments, the system includes a magnetic field source. The magnetic field source may be configured to apply a magnetic field to the magnetic sensor device (e.g., the magnetic sensor arrays) sufficient to produce a DC and/or AC field in the assay sensing area (e.g. in the area where the magnetic sensor arrays are positioned during signal acquisition). In some instances, the magnetic field source is configured to produce a magnetic field with a magnetic field strength of 1 Oe or more, or 5 Oe or more, or 10 Oe or more, or 20 Oe or more, or 30 Oe or more, or 40 Oe or more, or 50 Oe or more, or 60 Oe or more, or 70 Oe or more, or 80 Oe or more, or 90 Oe or more, or 100 Oe or more.

The magnetic field source may be positioned such that a magnetic field is produced in the area where the magnetic sensor arrays are positioned when the magnetic sensor device is in use. In some cases, the magnetic field source is configured to generate a uniform, controllable magnetic field around the set of fluid reservoirs on the reservoir plate where an assay is being performed. The magnetic field source may include one or more, such as two or more, three or more, four or more magnetic field generating components. In some cases, the magnetic field source may include one or more electromagnets, such as coil electromagnets. The coil electromagnets may include wire-wound coils. For example, the magnetic field source may include two electromagnets arranged in a Helmholtz coil geometry.

Embodiments of the systems further include computer-based systems. The systems may be configured to qualitatively and/or quantitatively assess binding interactions as described above. A "computer-based system" refers to the hardware, software, and data storage components used to analyze the signals from the magnetic sensors. The hardware of the computer-based systems may include a central processing unit (CPU), inputs, outputs, and data storage components. Any of a variety of computer-based systems is suitable for use in the subject systems. The data storage components may include any computer readable medium that includes a device for recording signals from the magnetic sensor arrays, or an accessible memory component that can store signals from the magnetic sensor arrays.

To "record" data, programming or other information on a computer readable medium refers to a process for storing information, using any such methods as known in the art. Any convenient data storage structure may be chosen, depending on the method used to access the stored information. A variety of data processor programs and formats can be used for storage, e.g. word processing text file, database format, etc.

In certain embodiments, the system includes an activation and signal processing unit. The activation and signal processing unit may be configured to operably couple to the magnetic sensor device. In some instances, the activation and signal processing unit is electrically coupled to the magnetic sensor device. The activation and signal processing unit may be electrically coupled such as to provide bi-directional communication to and from the magnetic sensor device. For example, the activation and signal processing unit may be configured to provide power, activation signals, etc. to components of the magnetic sensor device, such as, but not limited to the magnetic sensor arrays. As such, the activation and signal processing unit may include an activation signal generator. The activation signal generator may be configured to provide power, activation signals, etc. to components of the analyte detection device, such as, but not limited to the magnetic sensor arrays. In some instances, the activation and signal processing unit is configured to apply a voltage across the magnetic sensor arrays ranging from 1 mV to 10 V, such as 100 mV to 5 V, including 200 mV to 1 V, for example, 300 mV to 500 mV. In some cases, the activation and signal processing unit is configured to apply a voltage across the magnetic sensor arrays of 500 mV.

Additionally, the activation and signal processing unit may be configured to receive signals from the magnetic sensor device, such as from the magnetic sensor arrays of the magnetic sensor device. The signals from the magnetic sensor arrays of the magnetic sensor device may be used to detect the presence of one or more analytes in the samples. In some instances, the activation and signal processing unit may include a processor configured to output an analyte detection result in response to receiving signals from the magnetic sensor arrays. Thus, the processor of the activation and signal processing unit may be configured to receive signals from the magnetic sensor device, process the signals according to a predetermined algorithm, obtain a result related to the presence of one or more analytes in the samples, and output the result to a user in a human-readable or an audible format.

A "processor" references any hardware and/or software combination that will perform one or more programmed functions. For example, any processor herein may be a programmable digital microprocessor such as available in the form of an electronic controller, mainframe, server or personal computer (e.g., desktop or portable). Where the processor is programmable, suitable programming can be communicated from a remote location to the processor, or previously saved in a computer program product (such as a portable or fixed computer readable storage medium, whether magnetic, optical or solid-state device based). For example, a magnetic medium, optical disk or solid-state memory device may carry the programming, and can be read by a suitable reader communicating with the processor.

In some instances, the subject systems are configured to modulate the current applied to the magnetic sensor arrays (e.g., the sense current). The subject systems may also be configured to modulate the magnetic field generated by the magnetic field source. Modulating the sense current and the magnetic field may facilitate a minimization in signal noise, and thus a maximization in the signal to noise ratio. Additional aspects of modulating the sense current and the magnetic field are described in more detail in U.S. Application Publication No. 2011/0027901, filed on Apr. 13, 2010, the disclosure of which is incorporated herein by reference in its entirety.

Embodiments of the subject systems may also include the following components: (a) a wired or wireless communications module configured to transfer information between the system and one or more users, e.g., via a user computer, as described below; and (b) a processor for performing one or more tasks involved in the qualitative and/or quantitative analysis of the signals from the magnetic sensors. In certain embodiments, a computer program product is provided that includes a computer-usable medium having control logic (e.g., a computer software program, including program code) stored therein. The control logic, when executed by the processor of the computer, causes the processor to perform functions described herein. In other embodiments, some functions are implemented primarily in hardware using, for example, a hardware state machine. Implementation of the hardware state machine so as to perform the functions described herein may be accomplished using any convenient method and techniques.

In addition to the magnetic sensor device and activation and signal processing unit, the systems may include a number of additional components, such as, but not limited to: data output devices, e.g., monitors, speakers, etc.; data input devices, e.g., interface ports, buttons, switches, keyboards, etc.; fluid handling components, e.g., microfluidic components; power sources; power amplifiers; wired or wireless communication components; etc. For example, the systems may include fluid handling components, such as microfluidic fluid handling components. In certain embodiments, the microfluidic fluid handling components are configured to deliver a fluid to the inter-element areas. In some cases, the fluid includes one or more of the following: an assay composition, a sample, a magnetic label, a capture probe, a reagent, and the like. In certain instances, the microfluidic fluid handling components are configured to deliver small volumes of fluid, such as 1 mL or less, such as 500 μL or less, including 100 μL or less, for example 50 μL or less, or 25 μL or less, or 10 μL or less.

In certain embodiments, the system is a high-sensitivity analyte detector. By "high-sensitivity" is meant that the system is configured to detect an analyte in a sample, where the concentration of the analyte in the sample is low. In some cases, the system is configured to produce a detectable signal indicating the presence of an analyte of interest in a sample where the concentration of the analyte in the sample is 1 μM or less, such as 100 nM or less, or 10 nM or less, or 1 nM or less, including 100 pM or less, or 10 pM or less, or 1 pM or less, for example 500 fM or less, or 250 fM or less, or 100 fM or less, or 50 fM or less, or 25 fM or less, such as 10 fM or less, or 5 fM or less, or 1 fM or less. Stated another way, the system may be configured to have a detection limit, e.g., a lower limit of quantitation (LLOQ), of 1 μM or less, such as 100 nM or less, or 10 nM or less, or 1 nM or less, including 100 pM or less, or 10 pM or less, or 1 pM or less, for example 500 fM or less, or 250 fM or less, or 100 fM or less, or 50 fM or less, or 25 fM or less, such as 10 fM or less, or 5 fM or less, or 1 fM or less.

In certain embodiments, the systems include a display. The display may be configured to provide a visual indication of an analyte detection result obtained from the activation and signal processing unit, as described above. The display may be configured to display a qualitative analyte detection result. For instance, the qualitative display may be configured to display qualitative indicators to a user that a sample includes or does not include a specific analyte of interest. In some embodiments, the display may be configured to display an analyte detection result, where the analyte detection result is a quantitative result, e.g., a quantitative measurement of the concentration of an analyte in a sample. For example, in embodiments where the system is configured to output a quantitative analyte detection result, the system may include a display configured to display the quantitative analyte detection result.

The magnetic sensor device optionally includes a programmable memory, which prior to and during the use of the magnetic sensor device can be programmed with relevant information such as: calibration data for each individual sensor; a record of how the biochip has been prepared with surface functionalization molecules prior to the assay; a record of all completed assay steps; a record about which sample was measured; a record of the measurement results; and the like.

Methods

Aspects of the present disclosure also include a method for evaluating whether an analyte is present in a sample. The method includes contacting a magnetic sensor device with a sample to generate a signal. In addition, the method includes evaluating whether the analyte is present in each sample based on the signal.

Embodiments of the methods are directed to evaluating whether an analyte is present in a sample, e.g., determining the presence or absence of one or more analytes in a sample. In certain embodiments of the methods, the presence of one or more analytes in the sample may be determined qualitatively or quantitatively. Qualitative determination includes determinations in which a simple yes/no result with respect to the presence of an analyte in the sample is provided to a user. Quantitative determination includes both semi-quantitative determinations in which a rough scale result, e.g., low, medium, high, is provided to a user regarding the amount of analyte in the sample and fine scale results in which an exact measurement of the concentration of the analyte is provided to the user.

In some embodiments, the methods include the uniplex analysis of an analyte in a sample. By "uniplex analysis" is meant that a sample is analyzed to detect the presence of one analyte in the sample. For example, a sample may include a mixture of an analyte of interest and other molecular entities that are not of interest. In some cases, the methods include the uniplex analysis of the sample to determine the presence of the analyte of interest in the sample mixture.

Certain embodiments include the multiplex analysis of two or more analytes in a sample. By "multiplex analysis" is meant that the presence of two or more distinct analytes, in which the two or more analytes are different from each other, is determined. For example, analytes may include detectable differences in their molecular structure, sequence, and the like. In some instances, the number of analytes is greater than 2, such as 4 or more, 6 or more, 8 or more, etc., up to 20 or more, e.g., 50 or more, including 100 or more, or 1000 or more distinct analytes. In certain embodiments, the methods include the multiplex analysis of 2 to 1000 distinct analytes, such as 4 to 500 distinct analytes, including 4 to 200 distinct analytes, or 4 to 100 distinct analytes, or 4 to 50 distinct analytes, or 4 to 20 distinct analytes. In certain embodiments, several multiplex assays may be conducted in parallel substantially simultaneously.

In some instances, the methods are wash-free methods of evaluating the presence of one or more analytes in a sample. By "wash-free" is meant that no washing step is performed following reagent and/or sample contact with a magnetic sensor. As such, no step is performed during the assays of these embodiments in which unbound reagent (e.g., unbound magnetic labels) or unbound sample is removed from the magnetic sensor surface. Accordingly, while the methods may include sequential contact of one or more distinct reagents and/or samples to a magnetic sensor surface, at no point during the assay is the sample surface contacted with a fluid in a manner that removes unbound reagent or sample from the magnetic sensor surface. For example, in certain embodiments, no washing step is performed following contact of the magnetic sensor surface with a sample. In some cases, the method does not include a washing step following contact of the magnetic sensor surface with a magnetic label. In certain instances, no washing step is performed following contact of the magnetic sensor surface with a capture probe.

In certain embodiments where a wash step is performed, the wash step does not substantially change the signal from the magnetic sensor. The wash step may not result in a substantial change in the signal from the magnetic sensor because, in some instances, unbound magnetic labels do not have a substantially detectable signal as described herein. For example, if a wash step is performed, in some cases, the wash step results in a signal change of 25% or less, such as 20% or less, or 15% or less, or 10% or less or 5% or less, or 4% or less, or 3% or less, or 2% or less, or 1% or less. In some embodiments, the wash step results in a decrease in the signal from the magnetic sensor of 25% or less, such as 20% or less, or 15% or less, or 10% or less or 5% or less, or 4% or less, or 3% or less, or 2% or less, or 1% or less.

Aspects of the methods may also include obtaining a real-time signal from the magnetic sensor device. As such, embodiments of the method include obtaining a real-time signal from the magnetic sensor arrays. By "real-time" is meant that a signal is observed as it is being produced or immediately thereafter. For example, a real-time signal is obtained from the moment of its initiation and is obtained continuously over a given period of time. Accordingly, certain embodiments include observing the evolution in real time of the signal associated with the occurrence of a binding interaction of interest (e.g., the binding of the analyte of interest to the magnetic sensor or the inter-element area and/or binding of a magnetic label to the analyte of interest). The real-time signal may include two or more data points obtained over a given period of time, where in certain embodiments the signal obtained is a continuous set of data points (e.g., in the form of a trace) obtained continuously over a given period of time of interest. The time period of interest may vary, ranging in some instances from 0.5 min to 60 min, such as 1 min to 30 min, including 1 min to 15 min, or 1 min to 10 min. For example, the time period may begin at the moment of initiation of the real-time signal and may continue until the magnetic sensor reaches a maximum or saturation level (e.g., where all the analyte binding sites on the magnetic sensor are occupied). For example, in some cases, the time period begins when a sample is contacted with the magnetic sensor. In some cases, the time period may begin prior to contacting the sample with the magnetic sensor, e.g., to record a baseline signal before contacting sample to the magnetic sensor. The number of data points in the signal may also vary, where in some instances, the number of data points is sufficient to provide a continuous stretch of data over the time course of the real-time signal. By "continuous" is meant that data points are obtained repeatedly with a repetition rate of 1 data point per minute or more, such as 2 data points per minute or more, including 5 data points per minute or more, or 10 data points per minute or more, or 30 data points per minute or more, or 60 data points per minute or more (e.g., 1 data point per second or more), or 2 data points per second or more, or 5 data points per second or more, or 10 data points per second or more, or 20 data points per second or more, or 50 data points per second or more, or 75 data points per second or more, or 100 data points per second or more.

In certain embodiments, the real-time signal is a real-time analyte-specific signal. A real-time analyte-specific signal is a real-time signal as described above that is obtained only from the specific analyte of interest. In these embodiments, unbound analytes and unbound magnetic labels do not produce a detectable signal. In these embodiments, non-specifically bound analytes and non-specifically bound magnetic labels do not produce a detectable signal. As such, the real-time signal that is obtained is only from the specific magnetically-labeled analyte of interest bound to the magnetic sensor or inter-element area and substantially no signal is obtained from unbound or non-specifically bound magnetic labels or other reagents (e.g., analytes not specifically bound to the sensor).

In some embodiments, the signal is observed while the assay device is in a wet condition. By "wet" or "wet condition" is meant that the assay composition (e.g., an assay composition that includes a sample, a magnetic label, and a capture probe) is still in contact with the surface of the magnetic sensor. As such, there is no need to perform any washing steps to remove the non-binding moieties that are not of interest or the excess unbound magnetic labels or capture probes. In certain embodiments, the use of magnetic labels and magnetic sensors, as described above, facilitates "wet" detection because the signal induced in the magnetic sensor by the magnetic label decreases as the distance between the magnetic label and the surface of the magnetic sensor increases. For example, the use of magnetic labels and magnetic sensors, as described above, may facilitate "wet" detection because the magnetic field generated by the magnetic labels decreases as the distance between the magnetic label and the surface of the magnetic sensor increases. In some instances, the magnetic field of the magnetic label bound to the surface-bound analyte significantly exceeds the magnetic field from the unbound magnetic labels dispersed in solution. For example, as described above, a real-time analyte-specific signal may be obtained only from the specific magnetically-labeled analyte of interest bound to the magnetic sensor and substantially no signal may be obtained from unbound magnetic labels dispersed in solution (e.g., not specifically bound to the sensor). The unbound magnetic labels dispersed in solution may be at a greater distance from the surface of the magnetic sensor and may be in Brownian motion, which may reduce the ability of the unbound magnetic labels to induce a detectable change in the resistance of the magnetic sensor.

Assay Protocol

A typical assay protocol, as well as the individual components of the assay, is described in the following sections. In certain embodiments, the method includes contacting a magnetic sensor array with an assay composition that includes a sample. The magnetic sensor array may then be contacted with a magnetic label and a capture probe configured to bind to the magnetic label. A signal is obtained from the sensor to detect the presence of the analyte in the sample. Each of these steps will now be described in greater detail.

Sample

As described above, assay compositions that may be assayed in the subject methods include a sample. Samples that may be assayed in the subject methods may vary, and include both simple and complex samples. Simple samples are samples that include the analyte of interest, and may or may not include one or more molecular entities that are not of interest, where the number of these non-interest molecular entities may be low, e.g., 10 or less, 5 or less, etc. Simple samples may include initial biological or other samples that have been processed in some manner, e.g., to remove potentially interfering molecular entities from the sample. By "complex sample" is meant a sample that may or may not have the analytes of interest, but also includes many different proteins and other molecules that are not of interest. In some instances, the complex sample assayed in the subject methods is one that includes 10 or more, such as 20 or more, including 100 or more, e.g., $10^3$ or more, $10^4$ or more (such as 15,000; 20,000 or 25,000 or more) distinct (i.e., different) molecular entities, that differ from each other in terms of molecular structure.

In certain embodiments, the samples of interest are biological samples, such as, but not limited to, urine, blood, serum, plasma, saliva, perspiration, feces, cheek swabs, cerebrospinal fluid, cell lysate samples, and the like. The sample can be a biological sample or can be extracted from a biological sample derived from humans, animals, plants, fungi, yeast, bacteria, tissue cultures, viral cultures, or combinations thereof using conventional methods for the successful extraction of DNA, RNA, proteins and peptides. In some instances, the samples of interest are water, food or soil samples.

As described above, the samples that may be assayed in the subject methods may include one or more analytes of interest. Examples of detectable analytes include, but are not limited to: nucleic acids, e.g., double or single-stranded DNA, double or single-stranded RNA, DNA-RNA hybrids, DNA aptamers, RNA aptamers, etc.; proteins and peptides, with or without modifications, e.g., antibodies, diabodies, Fab fragments, DNA or RNA binding proteins, phosphorylated proteins (phosphoproteomics), peptide aptamers, epitopes, and the like; small molecules such as inhibitors, activators, ligands, etc.; oligo or polysaccharides; mixtures thereof; and the like.

Magnetic Labels

Assay compositions that may be assayed in the subject methods include a magnetic label. Magnetic labels are labeling moieties that are detectable by a sensor, such as a magnetic sensor, when the magnetic label is positioned near the magnetic sensor. While the distance between the magnetic label and magnetic sensor during detection may vary depending on the nature of the specific magnetic label and magnetic sensor, in some instances this distance ranges from 1 nm to 1000 nm from the magnetic sensor, or 1 nm to 800 nm from the magnetic sensor, such as from 5 nm to 500 nm, including from 5 nm to 100 nm. In certain embodiments, the magnetic labels are detectable labels that are configured to specifically bind to an analyte of interest. The terms "specific binding," "specifically bind," and the like, refer to the ability of a first binding molecule or moiety (e.g., a target-specific binding moiety) to preferentially bind directly to a second binding molecule or moiety (e.g., a target molecule) relative to other molecules or moieties in a solution or assay mixture. In certain embodiments, the affinity between a first binding molecule or moiety and a second binding molecule or moiety when they are specifically bound to each other in a binding complex is characterized by a $K_D$ (dissociation constant) of less than $10^{-6}$ M, less than $10^{-7}$ M, less than $10^{-8}$ M, less than $10^{-9}$ M, less than $10^{-19}$ M, less than $10^{-11}$ M, less than $10^{-12}$ M, less than $10^{-13}$ M, less than $10^{-14}$ M, or less than $10^{-15}$ M.

Binding of the magnetic label to the analyte of interest allows the analyte of interest to be detected by a magnetic sensor when the analyte of interest, and thus the bound magnetic label, is positioned near the magnetic sensor. In some cases, the magnetic labels are configured to bind directly to an analyte of interest. In other cases, the magnetic labels are configured to indirectly bind to an analyte of interest. For instance, a magnetic label may be configured to specifically bind to a capture probe, and the capture probe may be configured to specifically bind to the analyte of interest. Thus, binding of the magnetic label and the analyte of interest to the capture probe indirectly binds the magnetic label to the analyte of interest, e.g., to produce a labeled analyte. In some instances, the binding of the magnetic label and analyte to the capture probe is simultaneous.

In certain embodiments, the magnetic label is functionalized with one member of a binding pair. By "binding pair" or "specific binding pair" is meant two complementary binding molecules or moieties that specifically bind to each other in a binding complex. For example, a magnetic label may be functionalized with a first member of a binding pair and an analyte of interest may be functionalized with a second member of a binding pair. Thus, contacting the first and second members of the binding pair may form a binding complex between the magnetic label and the analyte of interest. In other cases, a magnetic label is functionalized with a first member of a binding pair and a capture probe is functionalized with a second member of a binding pair. Thus, contacting the first and second members of the binding pair may form a binding complex between the magnetic label and the capture probe. As described above, in some cases, the capture probe is configured to specifically bind to an analyte of interest. As such, the magnetic label may be indirectly bound to the analyte of interest through the binding complex formed between the magnetic label and the capture probe. Suitable specific binding pairs include, but are not limited to: a member of a receptor/ligand pair; a ligand-binding portion of a receptor; a member of an antibody/antigen pair; an antigen-binding fragment of an antibody; a hapten; a member of a lectin/carbohydrate pair; a member of an enzyme/substrate pair; biotin/avidin; biotin/streptavidin; digoxin/antidigoxin; and the like.

In certain embodiments, the magnetic label is functionalized with streptavidin and the capture probe is functionalized with biotin. As such, the magnetic label may specifically bind to the capture probe through the specific binding interaction between streptavidin and biotin. Other types of binding interactions are also possible. For example, the magnetic label may be functionalized with biotin and the capture probe may be functionalized with streptavidin. Alternatively, the magnetic label and the capture probe may be functionalized with complementary members of other specific binding pairs, as described above.

In some instances, the magnetic label is stably associated with one member of a binding pair. By "stably associated" is meant that the magnetic label and the member of the binding pair maintain their position relative to each other in space under the conditions of use, e.g., under the assay conditions. As such, the magnetic label and the member of the binding pair can be non-covalently or covalently stably associated with each other. Examples of non-covalent association include non-specific adsorption, binding based on electrostatic (e.g., ion-ion pair interactions), hydrophobic interactions, hydrogen bonding interactions, and the like. Examples of covalent binding include covalent bonds formed between the member of the binding pair and a functional group present on the surface of the magnetic label.

In certain embodiments, the magnetic labels are colloidal. The terms "colloid" or "colloidal" refer to a mixture in which one substance is dispersed throughout another substance. Colloids include two phases, a dispersed phase and a continuous phase. In some instances, colloidal magnetic labels remain dispersed in solution and do not precipitate or settle out of solution. Colloidal magnetic labels that remain dispersed in solution may facilitate a minimization in background signals and non-specific interaction of the magnetic labels with the magnetic sensor or inter-element area. For example, the methods may include contacting a magnetic sensor with an assay composition that includes a sample and a magnetic label, such that an analyte of interest in the sample is bound to the surface of the magnetic sensor or inter-element area. Because the colloidal magnetic labels remain dispersed in solution, the magnetic labels are not positioned near enough to the magnetic sensor to induce a detectable signal in the magnetic sensor, which facilitates a minimization in background signals. In some cases, specific binding of the magnetic labels to the surface-bound analyte positions the magnetic label near the magnetic sensor, such that a detectable signal is induced in the magnetic sensor.

Magnetic labels that may be employed in various methods (e.g., as described herein) may vary, and include any type of label that induces a detectable signal in a magnetic sensor when the magnetic label is positioned near the surface of the magnetic sensor. For example, magnetic labels may include, but are not limited to, magnetic labels, optical labels (e.g., surface enhanced Raman scattering (SERS) labels), fluorescent labels, and the like. Each of these types of magnetic labels is discussed in more detail below.

Magnetic labels are labeling moieties that, when sufficiently associated with a magnetic sensor or inter-element area, are detectable by the magnetic sensor and cause the magnetic sensor to output a signal. For example, the presence of a magnetic label near the magnetic sensor may induce a detectable change in the magnetic sensor, such as, but not limited to, a change in resistance, conductance, inductance, impedance, etc. In some cases, the presence of a magnetic label near the magnetic sensor induces a detectable change in the resistance of the magnetic sensor. Magnetic labels of interest may be sufficiently associated with a magnetic sensor if the distance between the center of the magnetic label and the magnetic sensor is 1000 nm or less, such as 800 nm or less, such as 400 nm or less, including 100 nm or less.

In certain instances, the magnetic labels include one or more materials selected from paramagnetic, superparamagnetic, ferromagnetic, ferromagnetic, antiferromagnetic materials, combinations thereof, and the like. For example, the magnetic labels may include superparamagnetic materials. In certain embodiments, the magnetic labels are configured to be nonmagnetic in the absence of an external magnetic field. By "nonmagnetic" is meant that the magnetization of a magnetic labels is zero or averages to zero over a certain period of time. In some cases, the magnetic label may be nonmagnetic due to random flipping of the magnetization of the magnetic label over time. Magnetic labels that are configured to be nonmagnetic in the absence of an external magnetic field may facilitate the dispersion of the magnetic labels in solution because nonmagnetic labels do not normally agglomerate in the absence of an external magnetic field or even in the presence of a small magnetic field in which thermal energy is still dominant. In certain embodiments, the magnetic labels include superparamagnetic materials or synthetic antiferromagnetic materials. For instance, the magnetic labels may include two or more layers of antiferromagnetically-coupled ferromagnets.

In certain embodiments, the magnetic labels are high moment magnetic labels. The magnetic moment of a magnetic label is a measure of its tendency to align with an external magnetic field. By "high moment" is meant that the magnetic labels have a greater tendency to align with an external magnetic field. Magnetic labels with a high magnetic moment may facilitate the detection of the presence of the magnetic labels near the surface of the magnetic sensor because it is easier to induce the magnetization of the magnetic labels with an external magnetic field.

In certain embodiments, the magnetic labels include, but are not limited to, Co, Co alloys, ferrites, cobalt nitride, cobalt oxide, Co—Pd, Co—Pt, iron, iron oxides, iron alloys, Fe—Au, Fe—Cr, Fe—N, $Fe_3O_4$, Fe—Pd, Fe—Pt, Fe—Zr—Nb—B, Mn—N, Nd—Fe—B, Nd—Fe—B—Nb—Cu, Ni, Ni alloys, combinations thereof, and the like. Examples of high moment magnetic labels include, but are not limited to, Co, Fe or CoFe nanocrystals, which may be superparamagnetic at room temperature, and synthetic antiferromagnetic nanoparticles.

In some embodiments, the surface of the magnetic label is modified. In certain instances, the magnetic labels may be coated with a layer configured to facilitate stable association of the magnetic label with one member of a binding pair, as described above. For example, the magnetic label may be coated with a layer of gold, a layer of poly-L-lysine modified glass, dextran, and the like. In certain embodiments, the magnetic labels include one or more iron oxide cores imbedded in a dextran polymer. Additionally, the surface of the magnetic label may be modified with one or more surfactants. In some cases, the surfactants facilitate an increase in the water solubility of the magnetic labels. In certain embodiments, the surface of the magnetic labels is modified with a passivation layer. The passivation layer may facilitate the chemical stability of the magnetic labels in the assay conditions. For example, the magnetic labels may be coated with a passivation layer that includes gold, iron oxide, polymers (e.g., polymethylmethacrylate films), and the like.

In certain embodiments, the magnetic labels have a spherical shape. Alternatively, the magnetic labels can be disks, rods, coils, or fibers. In some cases, the size of the magnetic labels is such that the magnetic labels do not interfere with the binding interaction of interest. For example, the magnetic labels may be comparable to the size of the analyte and the capture probe, such that the magnetic labels do not interfere with the binding of the capture probe to the analyte. In some cases, the magnetic labels are magnetic nanoparticles, or contain multiple magnetic nanoparticles held together by a suitable binding agent. In some embodiments, the average diameter of the magnetic labels is from 5 nm to 250 nm, such as from 5 nm to 150 nm, including from 10 nm to 100 nm, for example from 25 nm to 75 nm. For example, magnetic labels having an average diameter of 5 nm, 10 nm, 20 nm, 25 nm, 30 nm, 35 nm, 40 nm, 45 nm, 50 nm, 55 nm, 60 nm, 70 nm, 80 nm, 90 nm, or 100 nm, as well as magnetic labels having average diameters in ranges between any two of these values, may be used with the subject methods. In some instances, the magnetic labels have an average diameter of 50 nm.

Magnetic labels and their conjugation to biomolecules are further described in U.S. Application Publication No. 2009/0104707, filed Sep. 19, 2008, the disclosure of which is hereby incorporated by reference in its entirety.

Assay Composition Production

In some instances, the method includes producing the assay composition by sequentially contacting the magnetic sensor array (e.g., array of biosensors) with the sample and the magnetic label. For example, the method may include contacting the magnetic sensor array first with the sample and subsequently with the magnetic label. Alternatively, the method may include contacting the magnetic sensor array first with the magnetic label and subsequently with the sample.

In other embodiments, the method includes combining the sample and the magnetic label to produce the assay composition and then contacting the magnetic sensor array with the assay composition. For instance, the method may include first combining the sample and the magnetic label to produce the assay composition. Then the magnetic sensor may be contacted with the assay composition, as described above. Subsequently, the method may include contacting the magnetic sensor with the capture probe, as described in detail below.

Capture Probe

A capture probe can be any molecule that specifically binds to a protein or nucleic acid sequence that is being targeted (e.g., the analyte of interest). Depending on the nature of the analyte, capture probes can be, but are not limited to, (a) single strands of DNA complementary to a unique region of the target DNA or RNA sequence for the detection of nucleic acids; (b) antibodies against an epitope of the peptidic analyte for the detection of proteins and peptides; (c) any recognition molecule, such as a member of a specific binding pair. For example, suitable specific binding pairs include, but are not limited to: a member of a receptor/ligand pair; a ligand-binding portion of a receptor; a member of an antibody/antigen pair; an antigen-binding fragment of an antibody; a hapten; a member of a lectin/carbohydrate pair; a member of an enzyme/substrate pair; biotin/avidin; biotin/streptavidin; digoxin/antidigoxin; and the like.

In certain embodiments, the capture probe includes an antibody. The capture probe antibody may specifically bind to an analyte of interest. In some cases, the capture probe is a modified antibody. The modified antibody may be configured to specifically bind to the analyte of interest and may also include one or more additional members of a specific binding pair. The one or more members of a specific binding pair may be configured to specifically bind to a complementary member of the specific binding pair. In certain instances, the complementary member of the specific binding pair is bound to the magnetic label, as described above. For example, the capture probe may be an antibody that specifically binds to an analyte of interest. In addition, the capture probe may be modified to include biotin. As described above, in certain embodiments, magnetic labels may be modified to include streptavidin. As such, the capture probe may be configured to specifically bind to the analyte of interest (e.g., through an antibody-antigen interaction) and to specifically bind to the magnetic label (e.g., through a streptavidin-biotin interaction). In some cases, the capture probe is configured to bind to the analyte of interest and the magnetic label. Stated another way, the capture probe may be configured such that specific binding of the analyte to the capture probe does not significantly interfere with the ability of the capture probe to specifically bind to the magnetic label. Similarly, the capture probe may be configured such that specific binding of the magnetic label to the capture probe does not significantly interfere with the ability of the capture probe to specifically bind to the analyte.

In certain embodiments, the capture probe specifically binds to an analyte of interest. In some cases, the capture probe can be identified so that the presence of the analyte of interest can then be detected. Capture probes may be identified by any of the methods described herein. For example, as described above, analytes may be directly or indirectly bound to a magnetic sensor or inter-element area. The capture probe may contact and specifically bind to the analyte of interest. As indicated above, the capture probe may be configured to bind to a magnetic label and the analyte of interest. In certain instances, simultaneous binding of the capture probe to surface-bound analyte and the magnetic label positions the magnetic label within the detection range of the magnetic sensor, such that a detectable signal is induced in the magnetic sensor.

In some cases, false-positive signals due to non-specific binding of the capture probe to moieties not of interest are minimized. For example, non-specific binding of the capture probe to other moieties not of interest, which are not bound to the surface of the magnetic sensor array and remain in solution, will not induce a detectable or non-negligible signal in the magnetic sensor because the magnetic label bound to the capture probe will not be positioned within the detection range of the magnetic sensor.

As described above, the magnetic label may be colloidal, such that the magnetic label remains dispersed in the assay composition solution. In certain instances, the kinetics of the capture probe diffusion to the surface of the magnetic sensor and binding to the analyte is significantly faster than the kinetics of the diffusion of the magnetic labels to the surface of the magnetic sensor. Having faster kinetics for the binding of the capture probe to the analyte than the diffusion of the magnetic label to the surface of the magnetic sensor array may facilitate a minimization in false positive signals due to non-specific positioning of the magnetic label within the detection range of the magnetic sensor.

In certain embodiments, the magnetic sensor arrays are contacted with the capture probe after the magnetic sensor arrays are contacted with the assay composition. Thus, the methods may include first producing an assay composition that includes a sample and a magnetic label. The magnetic sensor array may then be contacted with the assay composition. Subsequently, the magnetic sensor array may be contacted with a capture probe.

Other methods are also possible. For example, the method may include first contacting the magnetic sensor arrays to the capture probe, and subsequently contacting the magnetic sensor arrays to the assay composition, where the assay composition includes a sample and a magnetic label. In both of the methods described above, the magnetic label is present in the assay composition prior to contacting the magnetic sensor array to the capture probe.

As described above, in some instances, the methods are wash-free methods of evaluating the presence of one or more analytes in a sample. As such, in certain embodiments, contacting the magnetic sensor arrays with assay components does not include any washing steps before or after contacting the magnetic sensor arrays with each component of the assay composition. Thus, no washing step is performed either before or after the magnetic sensor is contacted with any of the assay components.

Obtaining a Signal to Determine Whether an Analyte is Present in a Sample

Embodiments of the subject methods also include obtaining a signal from a magnetic sensor to detect the presence of an analyte in a sample. As described above, a magnetic label may be bound, either directly or indirectly, to the analyte, which in turn may be bound, either directly or indirectly, to the magnetic sensor. If the bound magnetic label is positioned within the detection range of the magnetic sensor, then the magnetic sensor may provide a signal indicating the presence of the bound magnetic label, and thus indicating the presence of the analyte.

Magnetic sensors may be configured to generate an electrical signal in response to a magnetic label in proximity to the magnetic sensor. For example, a change in the resistance of the magnetic sensor may be induced by changes in the local magnetic field. In some cases, binding of a magnetic label (e.g., a magnetic label) in close proximity to the magnetic sensor induces a detectable change in the local magnetic field of the magnetic sensor. For example, the magnetic field created by the magnetic labels that are bound to the analytes of interest may exceed the magnetic field that is created by unbound magnetic labels that remain dispersed in the sample. Changes in the local magnetic field of the magnetic sensor may be detected as a change in the resistance of the magnetic sensor. In certain embodiments, unbound magnetic labels do not produce a detectable signal in the magnetic sensor.

Utility

The subject methods, systems and kits find use in a variety of different applications where determination of the presence or absence, and/or quantification of one or more analytes in a sample is desired. In certain embodiments, the methods are directed to detection of a set of biomarkers, e.g., 2 or more distinct protein biomarkers, in a sample. For example, the methods of invention may be used in the rapid, clinical detection of 2 or more disease biomarkers in a serum sample, e.g., as may be employed in the diagnosis of a disease condition in a subject, in the ongoing management or treatment of a disease condition in a subject, etc.

In certain embodiments, the subject methods, systems and kits find use in detecting biomarkers. In some cases, the subject methods, systems and kits may be used to detect the presence or absence of particular biomarkers, as well as an increase or decrease in the concentration of particular biomarkers in blood, plasma, serum, or other bodily fluids or excretions, such as but not limited to saliva, urine, cerebrospinal fluid, lacrimal fluid, perspiration, gastrointestinal fluid, amniotic fluid, mucosal fluid, pleural fluid, sebaceous oil, exhaled breath, and the like.

The presence or absence of a biomarker or significant changes in the concentration of a biomarker can be used to diagnose disease risk, presence of disease in an individual, or to tailor treatments for the disease in an individual. For example, the presence of a particular biomarker or panel of biomarkers may influence the choices of drug treatment or administration regimes given to an individual. In evaluating potential drug therapies, a biomarker may be used as a surrogate for a natural endpoint such as survival or irreversible morbidity. If a treatment alters the biomarker, which has a direct connection to improved health, the biomarker can serve as a surrogate endpoint for evaluating the clinical benefit of a particular treatment or administration regime. Thus, personalized diagnosis and treatment based on the particular biomarkers or panel of biomarkers detected in an individual are facilitated by the subject methods and systems. Furthermore, the early detection of biomarkers associated with diseases is facilitated by the picomolar and/or femtomolar sensitivity of the subject methods and systems. Due to the capability of detecting multiple biomarkers on a single chip, combined with sensitivity, scalability, and ease of use, the presently disclosed assay methods and systems finds use in portable and point-of-care or near-patient multiplexed molecular diagnostics.

In certain embodiments, the subject methods, systems and kits find use in detecting biomarkers for a disease or disease state. In some cases, the disease is a cellular proliferative disease, such as but not limited to, a cancer, a tumor, a papilloma, a sarcoma, or a carcinoma, and the like. Thus, the subject methods, systems and kits find use in detecting the presence of a disease, such as a cellular proliferative disease, such as a cancer, tumor, papilloma, sarcoma, carcinoma, or the like. In certain instances, particular biomarkers of interest for detecting cancer or indicators of a cellular proliferative disease include, but are not limited to the following: C-reactive protein, which is an indicator of inflammation; transcription factors, such as p53, which facilitates cell cycle and apoptosis control; polyamine concentration, which is an indicator of actinic keratosis and squamous cell carcinoma; proliferating cell nuclear antigen (PCNA), which is a cell cycle related protein expressed in the nucleus of cells that are in the proliferative growth phase; growth factors, such as IGF-I; growth factor binding proteins, such as IGFBP-3; micro-RNAs, which are single-stranded RNA molecules of about 21-23 nucleotides in length that regulate gene expression; carbohydrate antigen CA19.9, which is a pancreatic and colon cancer biomarker; prostate specific membrane antigen, which is a prostate cancer biomarker; cyclin-dependent kinases; epithelial growth factor (EGF); vascular endothelial growth factor (VEGF); protein tyrosine kinases; overexpression of estrogen receptor (ER) and progesterone receptor (PR); and the like.

In certain embodiments, the subject methods, systems and kits find use in detecting biomarkers for an infectious disease or disease state. In some cases, the biomarkers can be molecular biomarkers, such as but not limited to proteins, nucleic acids, carbohydrates, small molecules, and the like. Particular diseases or disease states that may be detected by the subject methods, systems and kits include, but are not limited to, bacterial infections, viral infections, increased or decreased gene expression, chromosomal abnormalities (e.g. deletions or insertions), and the like. For example, the subject methods, systems and kits can be used to detect gastrointestinal infections, such as but not limited to, aseptic meningitis, botulism, cholera, E. coli infection, hand-foot-mouth disease, helicobacter infection, hemorrhagic conjunctivitis, herpangina, myocaditis, paratyphoid fever, polio, shigellosis, typhoid fever, vibrio septicemia, viral diarrhea, etc. In addition, the subject methods, systems and kits can be used to detect respiratory infections, such as but not limited to, adenovirus infection, atypical pneumonia, avian influenza, bubonic plague, diphtheria, influenza, measles, meningococcal meningitis, mumps, parainfluenza, pertussis (i.e., whooping cough), pneumonia, pneumonic plague, respiratory syncytial virus infection, rubella, scarlet fever, septicemic plague, severe acute respiratory syndrome (SARS), tuberculosis, etc. In addition, the subject methods, systems and kits can be used to detect neurological diseases, such as but not limited to, Creutzfeldt-Jakob disease, bovine spongiform encephalopathy (i.e., mad cow disease), Parkinson's disease, Alzheimer's disease, rabies, etc. In addition, the subject methods, systems and kits can be used to detect urogenital diseases, such as but not limited to, AIDS, chancroid, Chlamydia, condyloma accuminata, genital herpes, gonorrhea, lymphogranuloma venereum, non-gonococcal urethritis, syphilis, etc. In addition, the subject methods, systems and kits can be used to detect viral hepatitis diseases, such as but not limited to, hepatitis A, hepatitis B, hepatitis C, hepatitis D, hepatitis E, etc. In addition, the subject methods, systems and kits can be used to detect hemorrhagic fever diseases, such as but not limited to, Ebola hemorrhagic fever, hemorrhagic fever with renal syndrome (HFRS), Lassa hemorrhagic fever, Marburg hemorrhagic fever, etc. In addition, the subject methods, systems and kits can be used to detect zoonosis diseases, such as but not limited to, anthrax, avian influenza, brucellosis, Creutzfeldt-Jakob disease, bovine spongiform encephalopathy (i.e., mad cow disease), enterovirulent E. coli infection, Japanese encephalitis, leptospirosis, Q fever, rabies, sever acute respiratory syndrome (SARS), etc. In addition, the subject methods, systems and kits can be used to detect arbovirus infections, such as but not limited to, Dengue hemorrhagic fever, Japanese encephalitis, tick-borne encephalitis, West Nile fever, Yellow fever, etc. In addition, the subject methods, systems and kits can be used to detect antibiotics-resistance infections, such as but not limited to, Acinetobacter baumannii, Candida albicans, Enterococci sp., Klebsiella pneumoniae, Pseudomonas aeruginosa, Staphylococcus aureus, etc. In addition, the subject methods, systems and kits can be used to detect vector-borne infections, such as but not limited to, cat scratch disease, endemic typhus, epidemic typhus, human ehrlichosis, Japanese spotted fever, louse-borne relapsing fever, Lyme disease, malaria, trench fever, Tsutsugamushi disease, etc.

Similarly, the subject methods, systems and kits can be used to detect cardiovascular diseases, central nervous diseases, kidney failures, diabetes, autoimmune diseases, and many other diseases.

Kits

Also provided are kits for practicing one or more embodiments of the above-described methods. The subject kits may vary, and may include various devices and reagents. Reagents and devices include those mentioned herein with respect to magnetic sensor devices or components thereof (such as a magnetic sensor array), magnetic labels, capture probes, analyte-specific probes, buffers, etc. The reagents, magnetic labels, capture probes, etc. may be provided in separate containers, such that the reagents, magnetic labels, capture probes, etc. may be used individually as desired. Alternatively, one or more reagents, magnetic labels, capture probes, etc. may be provided in the same container such that the one or more reagents, magnetic labels, capture probes, etc. is provided to a user pre-combined.

In certain embodiments, the kits include a magnetic sensor device as described above, and a magnetic label. For example, the magnetic label may be a magnetic nanoparticle, as described above.

In some instances, the kits include at least reagents finding use in the methods (e.g., as described above); and a computer readable medium having a computer program stored thereon, wherein the computer program, when loaded into a computer, operates the computer to qualitatively and/or quantitatively determine a binding interaction of interest from a real-time signal obtained from a magnetic sensor; and a physical substrate having an address from which to obtain the computer program.

In addition to the above components, the subject kits may further include instructions for practicing the subject methods. These instructions may be present in the subject kits in a variety of forms, one or more of which may be present in the kit. One form in which these instructions may be present is as printed information on a suitable medium or substrate, e.g., a piece or pieces of paper on which the information is printed, in the packaging of the kit, in a package insert, etc. Yet another means would be a computer readable medium, e.g., CD, DVD, Bluray, computer readable memory device (e.g., a flash memory drive), etc., on which the information has been recorded. Yet another means that may be present is a website address which may be used via the Internet to access the information at a removed site. Any convenient means may be present in the kits.

Exemplary Non-Limiting Aspects of the Disclosure

Aspects, including embodiments, of the present subject matter described above may be beneficial alone or in combination, with one or more other aspects or embodiments. Without limiting the foregoing description, certain non-limiting aspects of the disclosure numbered 1-70 are provided below. As will be apparent to those of ordinary skill in the art upon reading this disclosure, each of the individually numbered aspects may be used or combined with any of the preceding or following individually numbered aspects. This is intended to provide support for all such combinations of aspects and is not limited to combinations of aspects explicitly provided below:

1. A magnetic sensor device comprising:
   a magnetic sensor element; and
   a passivation layer comprising two or more of zirconium oxide, aluminum oxide and tantalum oxide.
2. The magnetic sensor device according to 1, wherein the passivation layer comprises zirconium oxide and tantalum oxide.
3. The magnetic sensor device according to 1, wherein the passivation layer comprises zirconium oxide and aluminum oxide.
4. The magnetic sensor device according to claim 1, wherein the passivation layer comprises aluminum oxide and tantalum oxide.
5. The magnetic sensor device according to 1, wherein the passivation layer comprises zirconium oxide, aluminum oxide and tantalum oxide.
6. The magnetic sensor device according to any one of 1-5, wherein the passivation layer comprises: an atomic percentage of zirconium of from 30% to 70%; an atomic percentage of tantalum of from 30% to 70% and an atomic percentage of aluminum of 0% to 40%.
7. The magnetic sensor device according to 1, wherein the passivation layer comprises:
   zirconium oxide in an amount of from about 15% to about 65% by weight;
   aluminum oxide in an amount of from about 0% to about 25% by weight; and
   tantalum oxide in an amount of from about 35% to about 90% by weight.
8. The magnetic sensor device according to 7, wherein the passivation layer comprises:
   zirconium oxide in an amount of from about 20% to about 60% by weight;
   aluminum oxide in an amount of from about 0% to about 20% by weight; and
   tantalum oxide in an amount of from about 40% to about 85% by weight.
9. The magnetic sensor device according to 7, wherein the passivation layer comprises:
   zirconium oxide in an amount of about 31% by weight;
   aluminum oxide in an amount of about 13% by weight; and
   tantalum oxide in an amount of about 56% by weight.
10. The magnetic sensor device according to any one of 1-9, wherein the magnetic sensor comprises:
    a substrate;
    a magnetic sensor element positioned on top of the substrate;
    a mask layer positioned on top of the magnetic sensor element; and
    a passivation layer disposed on top of the hard mask layer, the passivation layer comprising zirconium oxide, aluminum oxide and tantalum oxide.
11. The magnetic sensor device according to any one of 1-10, wherein the magnetic sensor element comprises a plurality of layers.
12. The magnetic sensor device according to any one of 10-11, wherein the passivation layer encapsulates the magnetic sensor element and the mask layer.
13. The magnetic sensor device according to any one of 10-12, wherein the passivation layer extends from the top of the mask layer onto the substrate.
14. The magnetic sensor device according to any one of 10-13, wherein the passivation layer covers the edges of the magnetic sensor element.
15. The magnetic sensor device according to any one of 10-14, wherein the substrate surface comprises a recess.
16. The magnetic sensor device according to 15, wherein the recess extends from an edge of the magnetic sensor element.
17. The magnetic sensor device according to any one of 15-16, wherein the substrate beneath the magnetic sensor element is higher than the substrate in the recess.
18. The magnetic sensor device according to any one of 15-17, wherein the passivation layer covers the recess.
19. The magnetic sensor device according to any one of 15-18, wherein the depth of the recess is greater than the thickness of the passivation layer disposed on top of the mask layer.
20. The magnetic sensor device according to any one of 10-19, wherein the thickness of the passivation layer that covers the edge of the magnetic sensor element is less than the thickness of the passivation layer disposed on top of the mask layer.
21. The magnetic sensor device according to any one of 10-20, wherein the passivation layer disposed on top of the mask layer has a thickness of from about 10 nm to about 200 nm.
22. The magnetic sensor device according to any one of 10-21, wherein the passivation layer disposed on top of the mask layer has a thickness of about 30 nm.
23. The magnetic sensor device according to any one of 15-22, wherein the depth of the recess is from about 50 nm to about 100 nm.
24. The magnetic sensor device according to any one of 13-23, wherein the thickness of the passivation layer that covers the edge of the magnetic sensor element is from about 10 nm to about 100 nm.
25. The magnetic sensor device according to 24, wherein the thickness of the passivation layer that covers the edge of the magnetic sensor element is about 25 nm.
26. A magnetic sensor device comprising:
 a substrate;
 a magnetic sensor element; and
 a passivation layer that encapsulates the magnetic sensor element.
27. The magnetic sensor device according to 26, wherein the magnetic sensor comprises:
 a substrate;
 a magnetic sensor element positioned on top of the substrate;
 a mask layer positioned on top of the magnetic sensor element; and
 a passivation layer that encapsulates the magnetic sensor element and the mask layer.
28. The magnetic sensor device according to any one of 26-27, wherein the magnetic sensor element comprises a plurality of layers.
29. The magnetic sensor device according to any one of 26-28, wherein the passivation layer extends from the top of the mask layer onto the substrate.
30. The magnetic sensor device according to any one of 26-29, wherein the passivation layer covers the edges of the magnetic sensor element.
31. The magnetic sensor device according to any one of 26-30, wherein the substrate surface comprises a recess.
32. The magnetic sensor device according to 31, wherein the recess extends from an edge of the magnetic sensor element.
33. The magnetic sensor device according to any one of 31-32, wherein the substrate beneath the magnetic sensor element is higher than the substrate in the recess.
34. The magnetic sensor device according to any one of 31-33, wherein the passivation layer covers the recess.
35. The magnetic sensor device according to any one of 31-34, wherein the depth of the recess is greater than the thickness of the passivation layer disposed on top of the mask layer.
36. The magnetic sensor device according to any one of 30-35, wherein the thickness of the passivation layer that covers the edge of the magnetic sensor element is less than the thickness of the passivation layer disposed on top of the mask layer.
37. The magnetic sensor device according to any one of 26-36, wherein the passivation layer disposed on top of the mask layer has a thickness of from about 10 nm to about 200 nm.
38. The magnetic sensor device according to any one of 26-37, wherein the passivation layer disposed on top of the mask layer has a thickness of about 30 nm.
39. The magnetic sensor device according to any one of 31-38, wherein the depth of the recess is from about 50 nm to about 100 nm.
40. The magnetic sensor device according to any one of 30-39, wherein the thickness of the passivation layer that covers the edge of the magnetic sensor element is from about 10 nm to about 100 nm.
41. The magnetic sensor device according to 40, wherein the thickness of the passivation layer that covers the edge of the magnetic sensor element is about 25 nm.
42. A method of determining whether an analyte is present in a sample, the method comprising:
 producing a magnetic sensor device according to any one of 1-41; and
 obtaining a real-time signal from the magnetic sensor device to determine whether said analyte is present in said sample.
43. The method according to 42, wherein the producing comprises contacting the the magnetic sensor device with a sample to produce a sample exposed sensor.
44. The method according to 43, wherein the sample has been magnetically labeled prior to the contacting step.
45. The method according to 43, wherein the method comprises magnetically labeling the sample exposed sensor after the contacting step.
46. The method according to 42, wherein the producing comprises:
 (a) positioning the sample on a surface of the magnetic sensor device to produce a sample displaying sensor surface; and
 (b) magnetically labeling the sample displaying sensor surface.
47. The method according to 42, wherein the magnetic sensor device comprises two or more distinct magnetic sensor elements that each specifically detects a distinct analyte.
48. The method according to 47, wherein the magnetic sensor device comprises four or more distinct magnetic sensor elements that each specifically detects a distinct analyte.
49. The method according to 48, wherein the magnetic sensor device comprises 20 or less distinct magnetic sensors that each specifically detects a distinct analyte.
50. The method according to any one of 42-49, wherein the magnetic sensor element comprises a spin valve sensor.
51. The method according to any one of 42-49, wherein the magnetic sensor element comprises a magnetic tunnel junction sensor.
52. The method according to any one of 42-49, wherein the magnetic sensor element comprises a giant magnetoresistive sensor.
53. The method according to any of 42-52, wherein the analyte is a protein.
54. The method according to any of 42-52, wherein the analyte is a nucleic acid.
55. The method according to any of 42-54, wherein the sample is a complex sample.
56. The method according to 55, wherein said complex sample is a serum sample.
57. A system comprising:
 a magnetic sensor device according to any one of 1-41; and a processor configured to obtain a real-time signal from said magnetic sensor device to determine whether an analyte is present in a sample.

58. The system according to 57, wherein the magnetic sensor element comprises a spin valve sensor.
59. The system according to 57, wherein the magnetic sensor element comprises a magnetic tunnel junction sensor.
60. The system according to 57, wherein the magnetic sensor element comprises a giant magnetoresistive sensor.
61. A system comprising:
    a magnetic sensor device according to any one of 1-41;
    a processor configured to obtain a real-time signal from said magnetic sensor device to determine whether an analyte is present in a sample, and/or to quantify the said analyte; and
    a magnetic label.
62. The system according to 61, wherein the magnetic sensor element comprises a spin valve sensor.
63. The system according to 61, wherein the magnetic sensor element comprises a magnetic tunnel junction sensor.
64. The system according to 61, wherein the magnetic sensor element comprises a giant magnetoresistive sensor.
65. The system according to any one of 61-64, wherein said magnetic label is a magnetic nanotag.
66. A kit comprising:
    a magnetic sensor device according to any one of 1-41
    a magnetic label.
67. The kit according to 66, wherein the magnetic sensor element comprises a spin valve sensor.
68. The kit according to 66, wherein the magnetic sensor element comprises a magnetic tunnel junction sensor.
69. The kit according to 66, wherein the magnetic sensor element comprises a giant magnetoresistive sensor.
70. The kit according to any one of 66-69, wherein said magnetic label is a magnetic nanotag.

EXAMPLES

The following examples are put forth so as to provide those of ordinary skill in the art with a complete disclosure and description of how to make and use the present invention, and are not intended to limit the scope of what the inventors regard as their invention nor are they intended to represent that the experiments below are all or the only experiments performed.

Example 1

Figure 3:
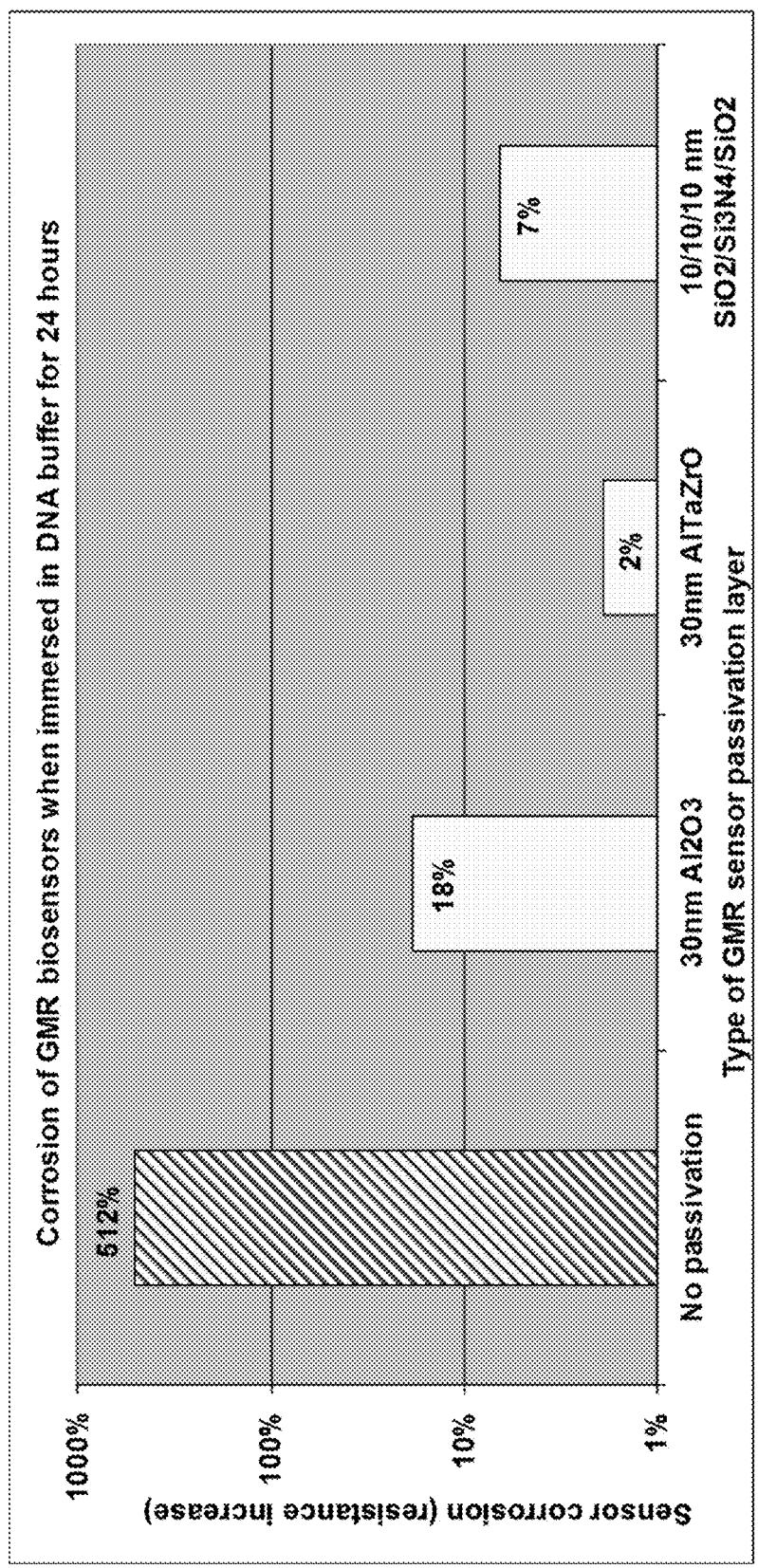
FIG. 3 effect of passivation layer annealing on corrosion of magnetic sensor devices according to certain embodiments.

The effect of passivation annealing was tested, by heating the chips to 150° C. for 30 minutes after the passivation layer was deposited. The results are shown in FIG. 3. The first observation is that even the relatively modest annealing temperature of 150° C. improved corrosion resistance in all cases. As shown in FIG. 3, no passivation of the magnetic sensor devices exhibited sensor corrosion of 512% as compared to sensors having a passivation layer. Passivation layers having only aluminum oxide exhibited 18% corrosion while silicon oxide-silicon nitride-silicon oxide passivation layers exhibited 7% corrosion. Magnetic sensor devices having a mixed oxide passivation layer (e.g., aluminum oxide-zirconium oxide-tantalum oxide) exhibited far greater corrosion resistance exhibiting only 2% corrosion. The silicon oxide-silicon nitride-silicon oxide passivation layer is, however, a three-layer passivation layer.

Although the foregoing invention has been described in some detail by way of illustration and example for purposes of clarity of understanding, it is readily apparent to those of ordinary skill in the art in light of the teachings of this invention that certain changes and modifications may be made thereto without departing from the spirit or scope of the appended claims.

Accordingly, the preceding merely illustrates the principles of the invention. It will be appreciated that those skilled in the art will be able to devise various arrangements which, although not explicitly described or shown herein, embody the principles of the invention and are included within its spirit and scope. Furthermore, all examples and conditional language recited herein are principally intended to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention as well as specific examples thereof, are intended to encompass both structural and functional equivalents thereof. Additionally, it is intended that such equivalents include both currently known equivalents and equivalents developed in the future, i.e., any elements developed that perform the same function, regardless of structure. The scope of the present invention, therefore, is not intended to be limited to the exemplary embodiments shown and described herein. Rather, the scope and spirit of present invention is embodied by the appended claims.

What is claimed is:

1. A magnetic sensor device comprising:
    a magnetic sensor element; and
    a passivation layer comprising zirconium oxide, aluminum oxide and tantalum oxide.
2. The magnetic sensor device according to claim 1, wherein the passivation layer comprises: an atomic percentage of zirconium of from 30% to 70%; an atomic percentage of tantalum of from 30% to 70% and an atomic percentage of aluminum of 0% to 40%.
3. The magnetic sensor device according to claim 1, wherein the passivation layer comprises:
    zirconium oxide in an amount of from about 15% to about 65% by weight;
    aluminum oxide in an amount of from about 0% to about 25% by weight; and
    tantalum oxide in an amount of from about 35% to about 90% by weight.
4. The magnetic sensor device according to claim 3, wherein the passivation layer comprises:
    zirconium oxide in an amount of from about 20% to about 60% by weight;
    aluminum oxide in an amount of from about 0% to about 20% by weight; and
    tantalum oxide in an amount of from about 40% to about 85% by weight.
5. The magnetic sensor device according to claim 4, wherein the passivation layer comprises:
    zirconium oxide in an amount of about 31% by weight;
    aluminum oxide in an amount of about 13% by weight; and
    tantalum oxide in an amount of about 56% by weight.
6. The magnetic sensor device according to claim 1, wherein the magnetic sensor element comprises a plurality of layers.
7. The magnetic sensor device according to claim 1, wherein the magnetic sensor comprises:
    a substrate;
    a magnetic sensor element positioned on top of the substrate;

a mask layer positioned on top of the magnetic sensor element; and a passivation layer disposed on top of the mask layer, the passivation layer comprising zirconium oxide, aluminum oxide and tantalum oxide.

8. The magnetic sensor device according to claim 7, wherein the passivation layer encapsulates the magnetic sensor element and the mask layer.

9. The magnetic sensor device according to claim 7, wherein the passivation layer extends from the top of the mask layer onto the substrate.

10. The magnetic sensor device according to claim 9, wherein the thickness of the passivation layer that covers the edge of the magnetic sensor element is from about 10 nm to about 100 nm.

11. The magnetic sensor device according to claim 10, wherein the thickness of the passivation layer that covers the edge of the magnetic sensor element is about 25 nm.

12. The magnetic sensor device according to claim 7, wherein the passivation layer covers the edges of the magnetic sensor element.

13. The magnetic sensor device according to claim 7, wherein a surface of the substrate comprises a recess.

14. The magnetic sensor device according to claim 13, wherein the recess extends from an edge of the magnetic sensor element.

15. The magnetic sensor device according to claim 13, wherein the substrate beneath the magnetic sensor element is higher than the substrate in the recess.

16. The magnetic sensor device according to claim 13, wherein the passivation layer covers the recess.

17. The magnetic sensor device according to claim 13, wherein the depth of the recess is greater than the thickness of the passivation layer disposed on top of the mask layer.

18. The magnetic sensor device according to claim 13, wherein the depth of the recess is from about 50 nm to about 100 nm.

19. The magnetic sensor device according to claim 7, wherein the thickness of the passivation layer that covers the edge of the magnetic sensor element is less than the thickness of the passivation layer disposed on top of the mask layer.

20. The magnetic sensor device according to claim 7, wherein the passivation layer disposed on top of the mask layer has a thickness of from about 10 nm to about 200 nm.

21. The magnetic sensor device according to claim 7, wherein the passivation layer disposed on top of the mask layer has a thickness of about 30 nm.

* * * * *